(12) United States Patent
Heald et al.

(10) Patent No.: US 9,085,457 B2
(45) Date of Patent: Jul. 21, 2015

(54) TREATMENT OF A SELF-ASSEMBLED MONOLAYER ON A DIELECTRIC LAYER FOR IMPROVED EPOXY ADHESION

(75) Inventors: David Leslie Heald, San Jose, CA (US); Majorio Arafiles Rafanan, San Jose, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 1154 days.

(21) Appl. No.: 13/046,558

(22) Filed: Mar. 11, 2011

(65) Prior Publication Data

US 2012/0229709 A1 Sep. 13, 2012

(51) Int. Cl.
*G09G 3/34* (2006.01)
*B81C 1/00* (2006.01)

(52) U.S. Cl.
CPC ..... *B81C 1/00269* (2013.01); *B81C 2203/0109* (2013.01); *B81C 2203/032* (2013.01); *Y10T 428/265* (2015.01)

(58) Field of Classification Search
None
See application file for complete search history.

(56) References Cited

U.S. PATENT DOCUMENTS

| | | | |
|---|---|---|---|
| 6,902,947 B2 | 6/2005 | Chinn et al. | |
| 7,348,193 B2 | 3/2008 | Quyang | |
| 7,446,926 B2 * | 11/2008 | Sampsell | 359/290 |
| 7,733,552 B2 | 6/2010 | Londergan et al. | |
| 2005/0012975 A1 | 1/2005 | George et al. | |
| 2007/0281492 A1 | 12/2007 | Chinn et al. | |
| 2008/0096313 A1 | 4/2008 | Patel et al. | |
| 2008/0111203 A1 | 5/2008 | Pan et al. | |
| 2010/0314724 A1 | 12/2010 | Hancer | |

FOREIGN PATENT DOCUMENTS

| | | |
|---|---|---|
| CN | 101290449 A | 10/2008 |
| CN | 101833216 A | 9/2010 |

OTHER PUBLICATIONS

International Search Report and Written Opinion—PCT/US2012/028117—ISA/EPO—Sep. 11, 2012.
Yamashita et al., "Investigation of Anti-Stiction Coating for MEMS Switch Using Atomic Force Microscope", Transducers and Eurosensors '07, 4th International Conference on Solid-State Sensors, Actuators and Microsystems, pp. 1657-1660, 2007.
Robinson et al., "Self-Assembled Films as Corrosion Protection Coatings for Metal Surfaces", Aerodyne Research, Inc., Final Report: ARI-3232-000; RR-1299, Mar. 31, 2007.
Second Written Opinion from international patent application No. PCT/US2012/028117, dated Mar. 11, 2013, 6 pp.
Japanese Office Action dated Jul. 29, 2014, issued in Application No. 2013-558057.
Chinese Office Action dated Feb. 28, 2015, issued in Application No. 201280022671.7.

* cited by examiner

*Primary Examiner* — Adam R Giesy
(74) *Attorney, Agent, or Firm* — Weaver Austin Villeneuve & Sampson LLP

(57) ABSTRACT

This disclosure provides systems, methods, and apparatus for treating a self-assembled monolayer coating on a dielectric layer to improve epoxy adhesion to the self-assembled monolayer coating. In implementations of the methods, a dielectric layer on a surface of a substrate is provided. A self-assembled monolayer coating is formed on the dielectric layer. A seal region of the self-assembled monolayer coating is selectively treated. A component is bonded to the seal region of the self-assembled monolayer coating with an epoxy. Implementations of the methods may be used to encapsulate an electromechanical systems device on the substrate with a cover using an epoxy.

33 Claims, 19 Drawing Sheets

| | Common Voltages | | | | |
|---|---|---|---|---|---|
| Segment Voltages | $VC_{ADD\_H}$ | $VC_{HOLD\_H}$ | $VC_{REL}$ | $VC_{HOLD\_L}$ | $VC_{ADD\_L}$ |
| $VS_H$ | Stable | Stable | Relax | Stable | Actuate |
| $VS_L$ | Actuate | Stable | Relax | Stable | Stable |

TREATMENT OF A SELF-ASSEMBLED MONOLAYER ON A DIELECTRIC LAYER FOR IMPROVED EPOXY ADHESION

TECHNICAL FIELD

This disclosure relates generally to electromechanical systems and more particularly to fabrication methods for microelectromechanical system devices.

DESCRIPTION OF THE RELATED TECHNOLOGY

Electromechanical systems include devices having electrical and mechanical elements, actuators, transducers, sensors, optical components (e.g., mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a metallic membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Electromechanical elements may be created using deposition, etching, lithography, and/or other micromachining processes that remove parts of substrates and/or deposited material layers, or that add layers to form electrical and electromechanical systems devices. Air gaps, i.e., regions in a structure where layers of material are separated by an open space, in electromechanical systems devices are commonly created during the fabrication process. In some electromechanical systems devices, an air gap might collapse, i.e., two separated layers of material may be made to come into contact with one another, and then return to their original state during the electromechanical systems device operation.

When two separated layers of material come into contact with one another, the adhesion of the layers to one another may prevent the two layers of material from returning to their original separated state, rendering the electromechanical systems device inoperable. The phenomenon of two such surfaces adhering together in this manner is called stiction (i.e., static friction). Stiction in electromechanical systems devices may be exacerbated by water vapor. Methods of reducing stiction in electromechanical systems devices include depositing stiction-reducing layers on the two separated layer of material. Stiction-reducing layers include dielectric layers and self-assembled monolayer (SAM) coatings.

SUMMARY

The systems, methods and devices of the disclosure each have several innovative aspects, no single one of which is solely responsible for the desirable attributes disclosed herein.

One innovative aspect of the subject matter described in this disclosure includes treatments of self-assembled monolayer coatings. In some implementations, a dielectric layer is provided on a surface of a substrate. A self-assembled monolayer is formed on the dielectric layer. A seal region of the self-assembled monolayer is selectively treated. A component is bonded to the seal region of the self-assembled monolayer with an epoxy.

In some implementations, a seal region of the self-assembled monolayer can be selectively treated by selectively exposing the seal region to ultraviolet light in an oxidizing atmosphere.

In some implementations, selectively treating a seal region of the self-assembled monolayer removes the tail groups of the self-assembled monolayer in the seal region.

In some implementations, an alumina layer is provided on a surface of a substrate. A self-assembled monolayer is formed on the alumina layer. A seal region of the self-assembled monolayer is treated by selectively exposing the seal region to ultraviolet light in an oxidizing atmosphere using a mask. The mask includes open regions defining the seal region. The selectively treated seal region of the self-assembled monolayer includes a silicon oxide layer. A component is bonded to the seal region of the self-assembled monolayer with an epoxy.

In some implementations, an apparatus includes a substrate including a surface. A dielectric layer is disposed on the surface of the substrate. A self-assembled monolayer is disposed on the dielectric layer. A seal region of the self-assembled monolayer includes a portion of the self-assembled monolayer that has been treated. A cover is bonded to the seal region of the self-assembled monolayer with an epoxy.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
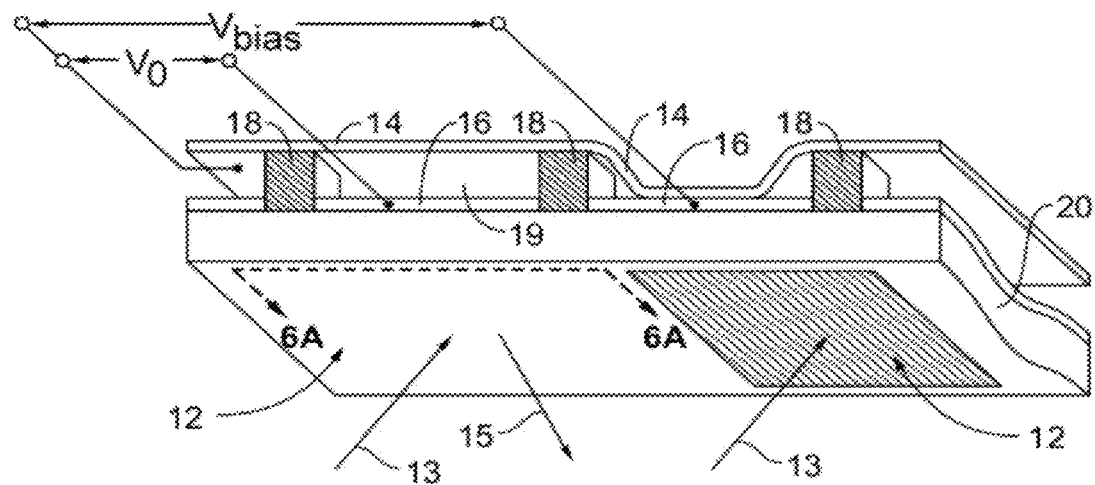
FIG. 1 shows an example of an isometric view depicting two adjacent pixels in a series of pixels of an interferometric modulator (IMOD) display device.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, packaging (e.g., MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the Figures, but instead have wide applicability as will be readily apparent to one having ordinary skill in the art.

Disclosed are methods of fabricating reliable electromechanical systems devices having reduced stiction. In implementations of the methods, a substrate with a dielectric layer on a surface of the substrate is provided. A self-assembled monolayer ("SAM") coating is formed on the dielectric layer. A seal region of the SAM coating is then treated, after which a component is bonded to the seal region of the SAM coating.

Implementations of the methods may be used to encapsulate an electromechanical systems device on a substrate with a cover. For example, two surfaces of an electromechanical systems device that are designed to come into contact with one another may be coated with a dielectric layer and a SAM coating to reduce stiction between the two surfaces. To encapsulate an electromechanical systems device, in some implementations, a cover is bonded to the substrate with an epoxy, enclosing the electromechanical systems device. Implementations of the methods improve the bonding characteristics of the epoxy and the SAM coating. Improvements in the epoxy/SAM coating bonding allow for the fabrication of electromechanical systems apparatus that will operate for a longer period of time before failure due to stiction.

Particular implementations of the subject matter described in this disclosure can be implemented to realize one or more of the following potential advantages. Improving the bonding characteristics of the epoxy and the SAM coating reduces stiction failure of an electromechanical systems device. When the epoxy and SAM coating bond fails, the electromechanical systems device encapsulated between the cover and the substrate is exposed to the atmosphere. The atmosphere includes water vapor, which may accelerate stiction failure and/or exacerbate stiction in an electromechanical systems device. Further, implementations of the method allow for larger substrates having electromechanical systems devices disposed on a surface to be effectively encapsulated with a cover using an epoxy.

One example of a suitable electromechanical systems device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be on the order of 1-1000 um, while the gap 19 may be on the order of <10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
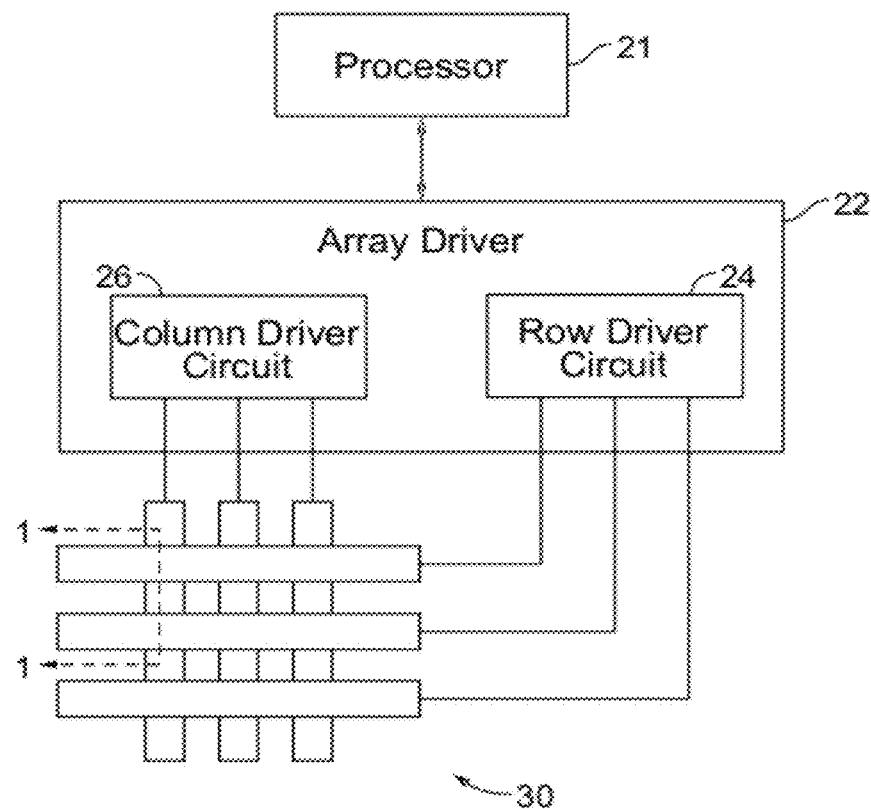
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
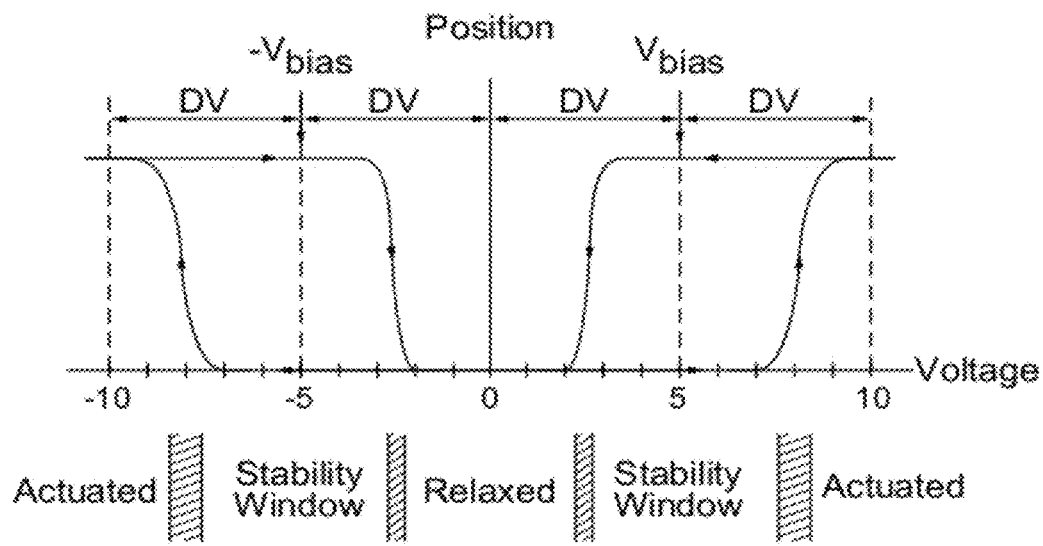
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10 volts, however, the movable reflective layer does not relax completely until the voltage drops below 2 volts. Thus, a range of voltage, approximately 3 to 7 volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10 volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7 volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
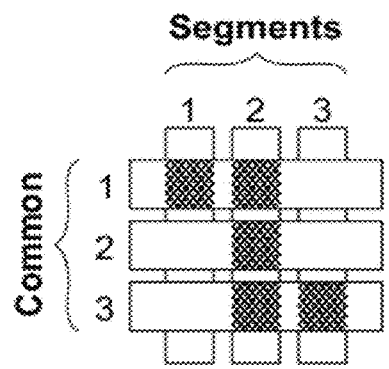
FIG. 5A shows an example of a diagram illustrating a frame of display data in the 3×3 interferometric modulator display of FIG. 2.
Figure 5B:
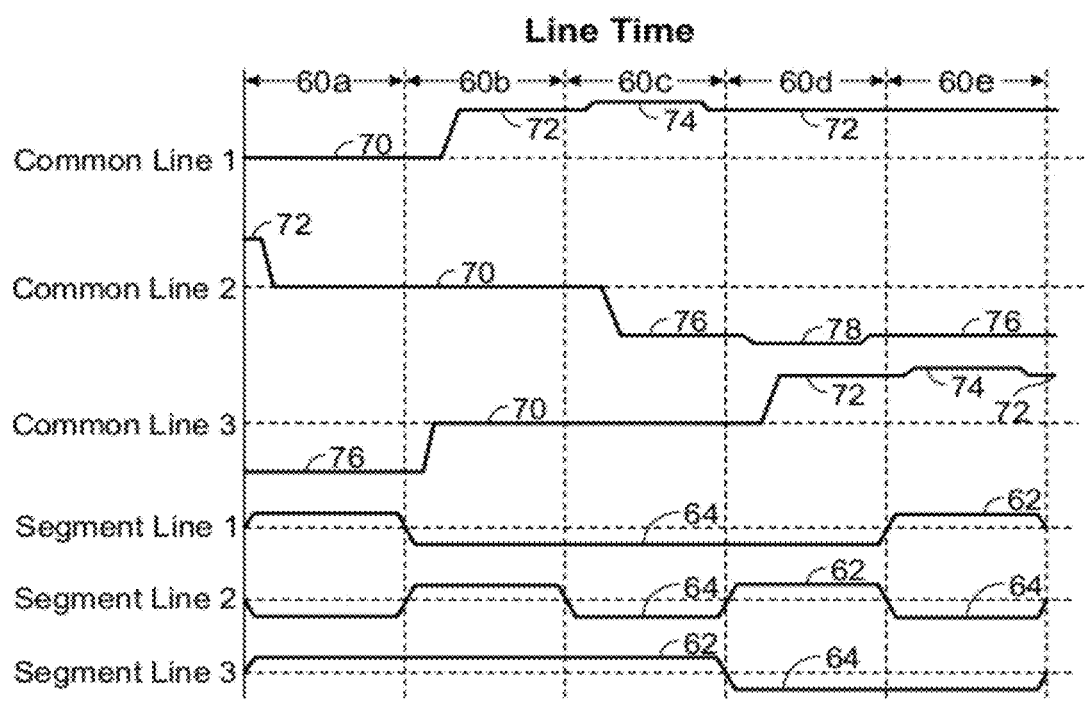
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a, a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
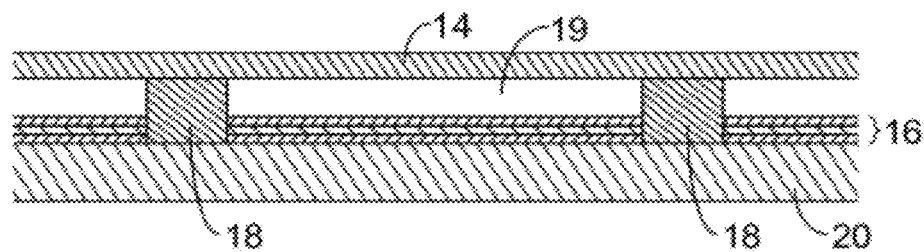
FIG. 6A shows an example of a partial cross-section of the interferometric modulator display of FIG. 1.
Figure 6B:
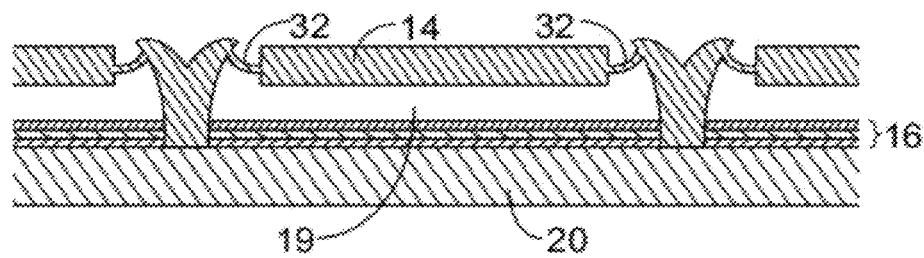
FIGS. 6B-6E show examples of cross-sections of varying implementations of interferometric modulators.
Figure 6C:
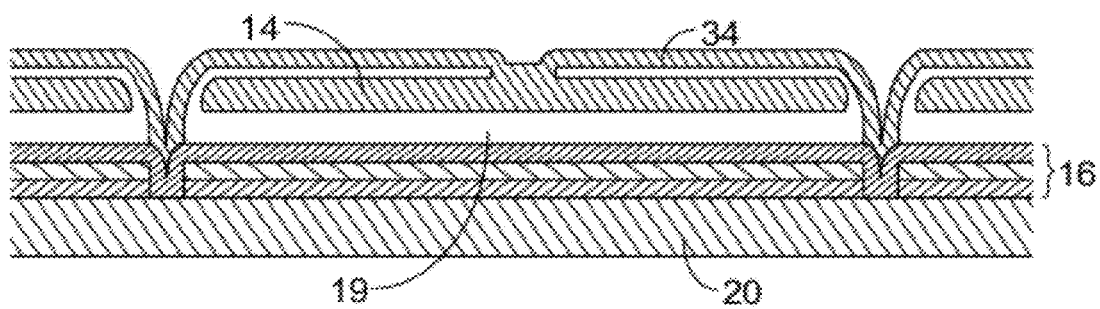

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
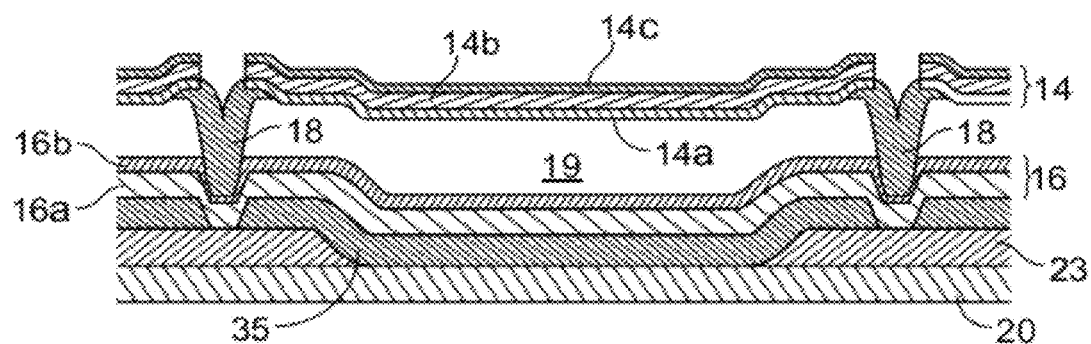

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, an $SiO_2$/SiON/$SiO_2$ tri-layer stack. Either or both of the reflective sub-layer 14a and the conductive layer 14c can include, e.g., an Al alloy with about 0.5% Cu, or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, $CF_4$ and/or $O_2$ for the MoCr and $SiO_2$ layers and $Cl_2$ and/or $BCl_3$ for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
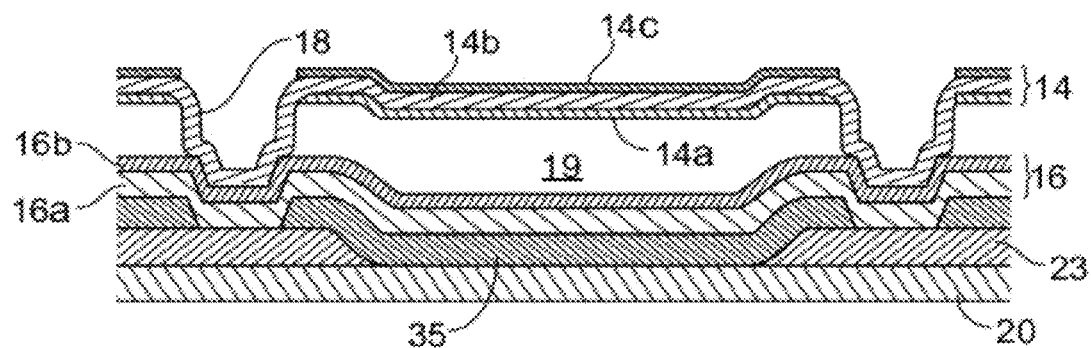

FIG. 6E shows another example of an IMOD, where the movable reflective layer 14 is self supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as, e.g., patterning.

Figure 7:
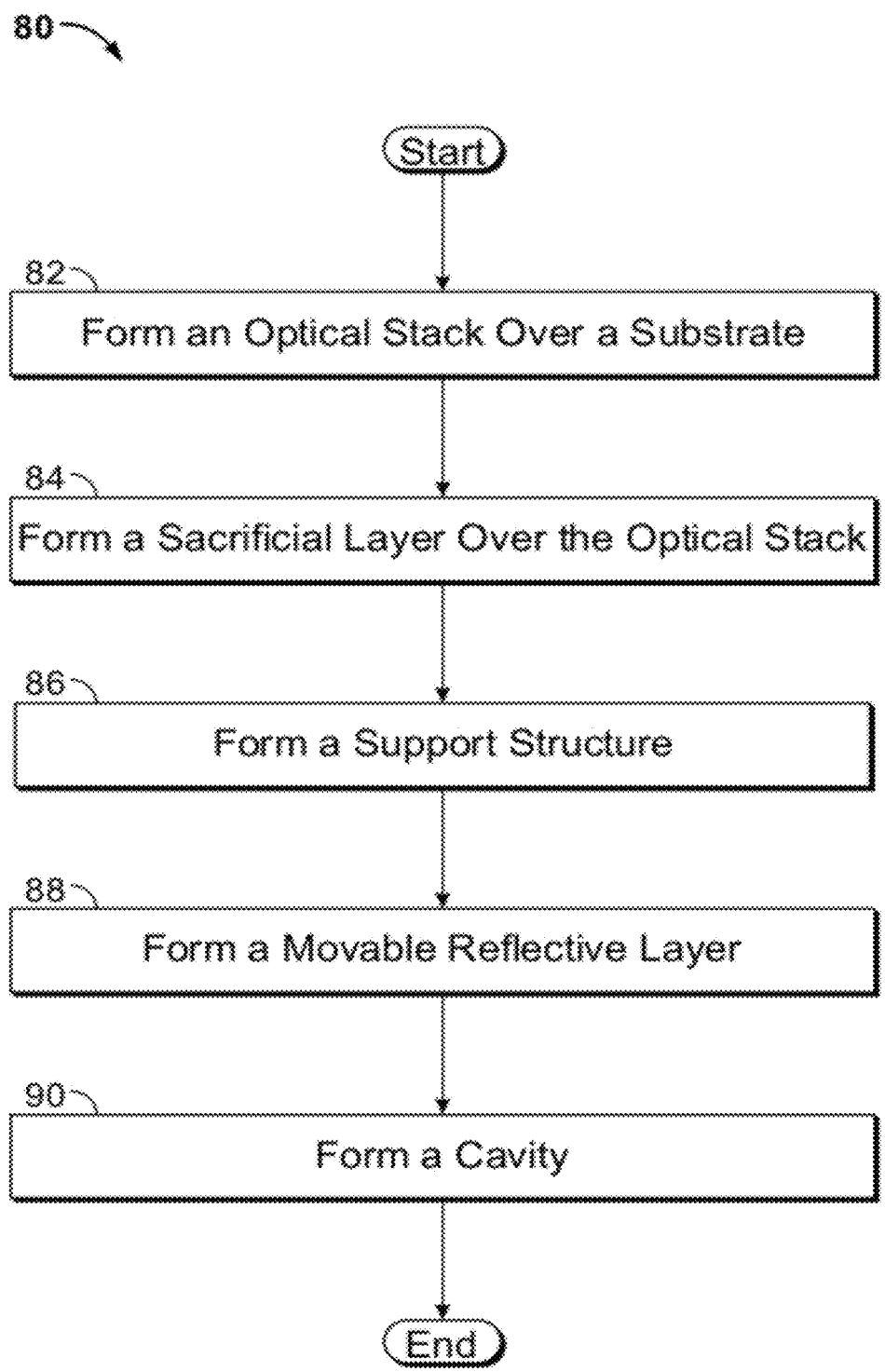
FIG. 7 shows an example of a flow diagram illustrating a manufacturing process for an interferometric modulator.
Figure 8A:
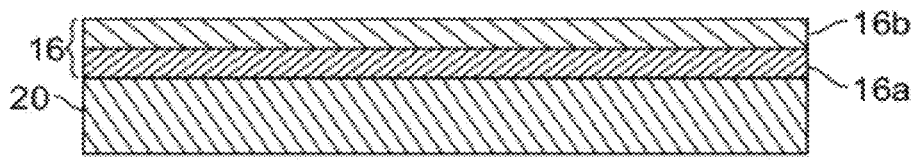
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
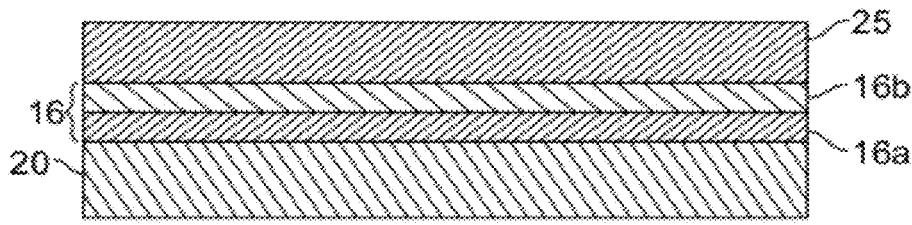

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
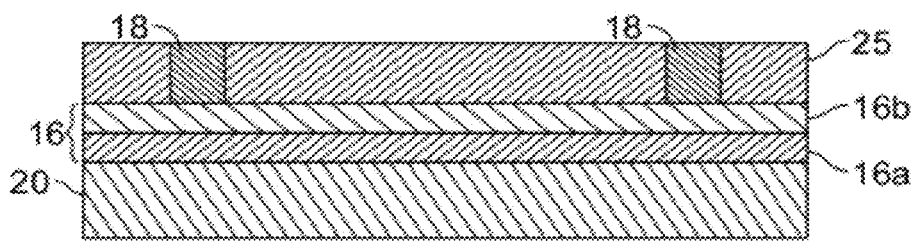

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
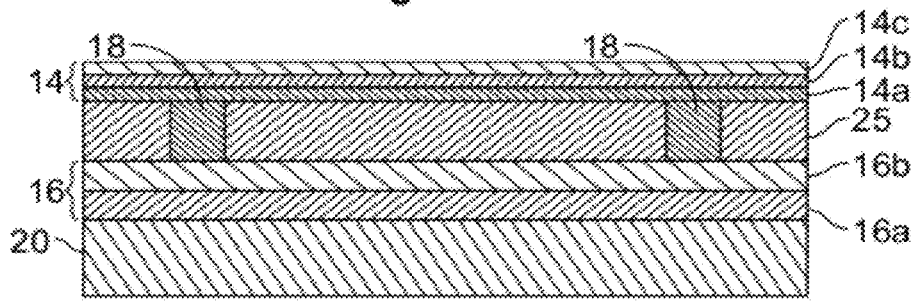
Figure 8E:
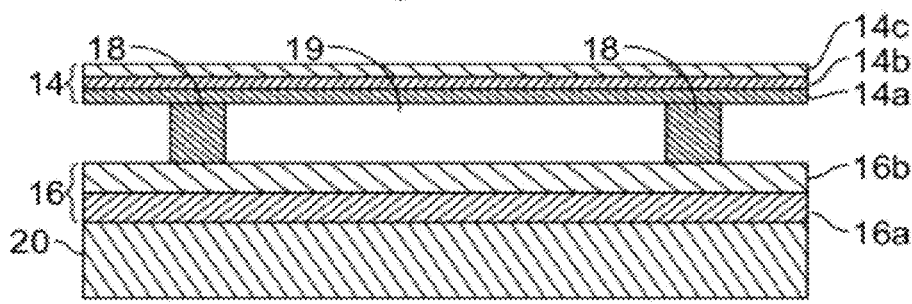

The process 80 continues at block 88 with the formation of a movable reflective layer or membrane such as the movable reflective layer 14 illustrated in FIGS. 1, 6 and 8D. The movable reflective layer 14 may be formed by employing one or more deposition processes, e.g., reflective layer (e.g., aluminum, aluminum alloy) deposition, along with one or more patterning, masking, and/or etching processes. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 may also be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other combinations of etchable sacrificial material and etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

As noted above, adhesion of two separated layers of material to one another when the two layers come into contact with one another is an issue in some electromechanical systems devices. The phenomenon of two such layers adhering to one another in this manner is called stiction (i.e., static friction). For example, in the IMOD display device shown in FIG. 1, when a voltage is applied to at least one of a selected row and column, the surface of the movable reflective layer 14 can deform and move against the surface of the optical stack 16. Stiction can cause these two layers to remain in contact when the voltage is removed and a restoring force would be expected to return the movable reflective layer to the relaxed position. Stiction occurs when the sum of adhesive forces biasing the IMOD 12 in the actuated position is greater than the sum of the restoring forces biasing the IMOD 12 towards the relaxed position. Adhesive forces may include electrostatic forces, capillary forces, van der Waals forces, and/or hydrogen bonding forces. Restoring forces may include mechanical tension forces of the actuated movable reflective layer 14. Because adhesive forces become relatively stronger and restoring forces become relatively weaker with decreasing device dimensions, stiction becomes more of an issue with decreasing device size, such as in electromechanical systems devices including nanoelectromechanical systems (NEMS) devices and microelectromechanical systems (MEMS) devices.

As noted above, adhesive forces may include electrostatic forces, capillary forces, van der Waals, and/or hydrogen bonding forces. Adhesive forces may also include other chemical bonding forces and forces due to trapped charges. All of these adhesive forces increase with increased contact area between movable components. For example, adhesive forces between the movable reflective layer 14 and the optical stack 16 increase with increased contact area between these two layers and decrease with increased separation between these two layers.

Without being bound by any theory, it is believed that stiction in some implementations of electromechanical systems devices, including IMOD display devices, is caused at least in part by residues of the manufacturing process left on surfaces that come into contact with one another. For example, in forming the optical cavity 19 of the IMOD 12 shown in FIG. 1 using a release etch of a sacrificial material, nonvolatile products of the etching process may be left behind as manufacturing residues in the cavity. In etching a Mo sacrificial material using $XeF_2$, non-volatile products can include nonvolatile molybdenum-containing products (for example, molybdenum oxy-fluorides), nonvolatile non-molybdenum-containing products (for example, products from impurities in the sacrificial material), residual photoresist (for example, incompletely stripped photoresist), and the like. Other sources of manufacturing residues may include reactions of the etchant with non-sacrificial materials, reactions of non-sacrificial materials exposed by a release etch to an atmosphere, by-products formed in the deposition and/or etching of adjacent layers, and products of reactions between adjacent layers.

Figure 9:
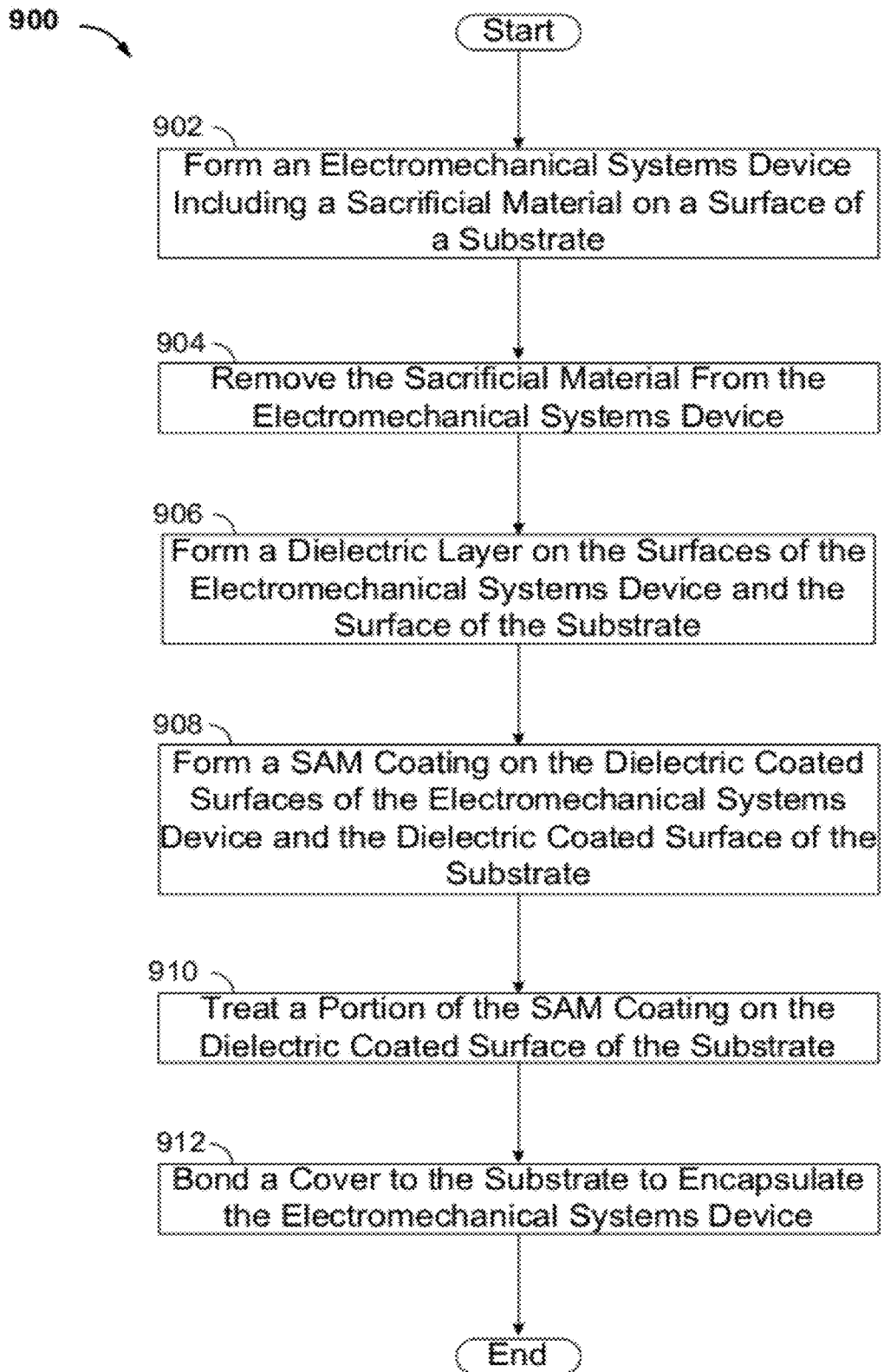
FIG. 9 shows an example of a flow diagram illustrating a manufacturing process for an electromechanical systems apparatus.

FIG. 9 shows an example of a flow diagram illustrating a manufacturing process for an electromechanical systems apparatus. At block 902, an electromechanical systems device including a sacrificial material is formed on a surface of a substrate. The electromechanical systems device may be any type of electromechanical systems device, including, for example, an IMOD device, as described above, a gyroscope device, an accelerometer device, or a microphone device. The substrate may include any appropriate material, including but not limited to, a glass, a plastic, a semiconductor material (for example, silicon), and the like. The substrate surface may include the substrate material and/or one or more layers of other materials formed on the substrate. The completed electromechanical systems device to be formed may include cavities or open spaces such that components of the electromechanical systems device are able to move with respect to one another and/or come into contact with one another. In some implementations, these cavities may be formed by using a sacrificial material. As noted above, examples of sacrificial materials include Mo and amorphous Si. One example of a process of forming an electromechanical systems device including a sacrificial material on a surface of a substrate is described above with reference to operations 82-88 of FIG. 7. One having ordinary skill in the art will understand that forming the electromechanical systems device may involve any number of deposition, etching, patterning, lithography, and/or other processing operations according to the desired implementation.

At block 904, the sacrificial material is removed from the electromechanical systems device. As noted above, in some implementations, the sacrificial material may be removed by exposing it to an etchant. For example, an etchable sacrificial material such as Mo or amorphous Si may be removed by dry chemical etching, e.g., by exposing the sacrificial material to a gaseous or vaporous etchant, such as vapors derived from solid $XeF_2$, for a period of time that is effective to remove the desired amount of material. Other etching methods, e.g., wet etching and/or plasma etching, may also be used. A mixture of hydrochloric acid (HCl) and nitric acid ($HNO_3$) may be used to wet etch Mo, for example. A carbon tetrafluoride ($CF_4$) plasma may be used plasma etch Mo, for example.

At block 906, a dielectric layer is formed on the surfaces of the electromechanical systems device and the surface of the substrate. The dielectric layer reduces stiction in some implementations. For example, forming a dielectric layer on the surfaces in an electromechanical systems device may cover residues from an etch process remaining on the surfaces, thereby greatly reducing or eliminating their contributions to stiction. A high-quality dielectric layer, such as that resulting from an atomic layer deposition ("ALD") process, may also minimize the charging of surfaces that may occur during the electromechanical systems device operation; in some instances, the charging of surfaces that may occur during electromechanical systems device operation may also contribute to stiction.

In some implementations, the dielectric layer is formed by an ALD process. ALD is a thin film deposition technique performed with one or more chemical reactants, also referred to as precursors. ALD is based on sequential, self-limiting surface reactions. The precursors are sequentially admitted to a reaction chamber in a gaseous state where they contact the workpiece (i.e., the surface or surfaces that are being coated). For example, a first precursor is adsorbed onto the surface when it is admitted to a reaction chamber. Then, the first precursor reacts with a second precursor at the surface when the second precursor is admitted to the reaction chamber. By repeatedly exposing a surface to alternating sequential pulses of the precursors, a thin film of dielectric material is deposited. ALD processes also include processes in which a surface is exposed to sequential pulses of a single precursor, which deposits a thin film of dielectric material on the surface. ALD generally forms a conformal layer, i.e., a layer that faithfully follows the contours of the underlying surface. Because ALD precursors are admitted to a reaction chamber in a gaseous state and do not depend on being activated by a plasma, and because ALD reaction rates are surface-limited, the film is deposited on all surfaces in the reaction chamber that are accessible to the gaseous precursors and suitable for deposition.

In some implementations, the dielectric layer includes an oxide layer (e.g., silicon oxide, aluminum oxide, zirconium oxide, hafnium oxide, yttrium oxide, tantalum oxide, silicon oxide doped with other oxides), a nitride layer (e.g., silicon nitride), an oxynitride layer, or a carbide layer. Oxides that silicon oxide may be doped with include praseodymium oxide.

In some implementations, the dielectric layer is aluminum oxide ($Al_2O_3$), also referred to as alumina. Conditions for depositing $Al_2O_3$ by ALD are known by one having ordinary skill in the art, and in some implementations include contacting a surface with a pulse of an aluminum precursor gas followed by a pulse of an oxygen precursor gas. In some implementations, $Al_2O_3$ is deposited by ALD using trimethyl aluminum (TMA) as an aluminum precursor gas and at least one of water ($H_2O$) or ozone ($O_3$) as an oxygen precursor gas. Other suitable precursor gases are known by one having ordinary skill in the art. For example, other suitable aluminum precursor gases include tri-isobutyl aluminum (TIBAL), tri-ethyl/methyl aluminum (TEA/TMA), and dimethylaluminum hydride (DMAH). For further description of methods and material for coating surfaces in electromechanical systems devices, see U.S. Pat. No. 7,733,552, which is herein incorporated by reference.

As noted above, a material deposited by ALD is deposited on all surfaces of the work piece that are accessible by the precursor gases and are suitable for deposition. In some implementations, $Al_2O_3$ or other dielectric material is deposited on the electromechanical systems device as well as the substrate on which the electromechanical systems device has been fabricated. In some other implementations, $Al_2O_3$ or other dielectric material is deposited on the electromechanical systems device as well as on other materials overlying the substrate on which the electromechanical systems device has been fabricated.

In some implementations, an $Al_2O_3$ or other dielectric layer that is deposited has a thickness of about 20 to 100 Angstroms. In some implementations, an $Al_2O_3$ or other dielectric layer that is deposited has a thickness of about 20 to 25 Angstroms, about 25 to 40 Angstroms, about 40 to 75 Angstroms, or about 75 to 80 Angstroms. The dielectric layer is generally thick enough to mask any residues that may be on the surfaces in the electromechanical systems device. The dielectric layer should not be too thick, however. For example, thicker dielectric layers in IMOD devices may translate to stiffer layers, which may in turn translate to higher voltages used to actuate IMOD devices. Further, in some implementations there is a limited space within which to deposit the dielectric layer in open cavities in an IMOD or other electromechanical systems device.

While a layer of dielectric yields stiction performance improvements in an electromechanical systems device, an electromechanical systems device that has had its surfaces coated with $Al_2O_3$ or other dielectric may still exhibit stiction. Without being bound by any theory, it is believed that the surface of the $Al_2O_3$ or other dielectric that is deposited via some ALD processes is terminated with reactive groups such as hydroxyl (—OH) groups. Any residues or other chemicals that are outgassed from components (e.g., epoxy or desiccant, described below) near the dielectric layer during fabrication or operation of the electromechanical systems device may react with the reactive groups. Such residues or chemicals may improve or degrade the stiction properties, depending on the properties of the residues or chemicals.

At block 908, a self-assembled monolayer (SAM) coating is formed on the dielectric-coated surfaces of the electromechanical systems device and the surface of the substrate. In some implementations, the dielectric layer is coated with a SAM coating to further reduce stiction. As used herein, a SAM coating is an organized layer of amphiphilic molecules. In some implementations, the amphiphilic molecules of the SAM coating have a polar, water-soluble group (i.e., the head group) attached to a nonpolar, water-insoluble hydrocarbon chain (i.e., the tail group). The head groups of the amphiphilic molecules show affinity for a substrate and bond to the substrate. The tail groups of the amphiphilic molecules extend from the head groups and present a hydrophobic surface. The tail groups presenting a hydrophobic surface in an electromechanical systems device further reduce the susceptibility of a surface to stiction.

Methods of forming a SAM coating on a surface are known by one having ordinary skill in the art. One method of forming a SAM coating on a surface is described below with reference to FIG. 10B. In some implementations, the SAM coating is or includes organosilanes or other silane molecules. For example, in some implementations, the SAM coating is a chlorosilane, such as a trichlorosilane, or a methoxysilane. In some implementations, tricholorosilanes of a SAM coating include a n-decyl-trichlorosilane (DTS), a n-dodecyl-trichlorosilane, a perfluordecyl-trichlorosilane (FDTS), or a n-octadecyltrichlorosilane. SAM coatings may further include amino-functionalized silanes, including dimethylaminosilanes, and alklysilanes, including alkyltricholorosilane or alkyltrimethoxysilane.

In some implementations, the SAM coating includes siloxane molecules, including organosiloxanes. For example, siloxanes include hexamethyl-di-silazane (HMDS). SAM coatings may also be based on other classes of chemicals, including amines, alcohols, and various acids, including carboxylic acids and phosphoric acids.

In some implementations, the tail groups of the SAM coating include at least about five carbon atoms, less than about fifteen carbon atoms, or between about five to fifteen carbon atoms, to achieve a reduction of stiction in an electromechanical systems device. Shorter tail groups may not have as much of an effect on stiction as longer tail groups. The mechanical integrity of longer tail groups, however, may not be as great as the mechanical integrity of shorter tail groups; i.e., during electromechanical systems device operation in which two SAM-coated surfaces contact one another, longer tail groups may break and loose their efficacy more quickly than shorter tail groups.

Methods of forming a SAM coating on a surface include gas phase reactions. As a result, in some implementations the SAM coating is coated on all surfaces of the electromechanical systems device and the substrate that are accessible by a gas and suitable for deposition.

At block 910, a portion of the SAM coating on the dielectric-coated surface of the substrate is treated. Methods of treating a SAM coating are described further, below, and in some implementations involve chemically and/or physically modifying the SAM coating to facilitate bonding a cover in a subsequent operation.

At block 912, a cover is bonded to the substrate to encapsulate the electromechanical systems device. As noted above, stiction in electromechanical systems devices may be exacerbated by water vapor. To isolate an electromechanical systems device from the water vapor in the atmosphere, in some implementations an electromechanical systems device is encapsulated in a package. In some implementations, the electromechanical systems device is encapsulated in a package with a desiccant. The desiccant may further remove water vapor from the volume encapsulated by the package. The cover completely surrounds the electromechanical systems device, and the electromechanical systems device is isolated between the cover and the substrate on which the electromechanical systems device is fabricated. In some implementations, the cover is bonded to the substrate with an epoxy. The encapsulation process also serves to provide mechanical protection for the electromechanical systems device in some implementations in addition to reducing moisture permeation into the cavity.

The cover may be any number of different materials having appropriate mechanical strength, corrosion resistance, and thermal expansion coefficient. In some implementations, the cover is a glass cover. Glass covers may be any type of glass used in the display industry, including borosilicate glasses. One specific glass used in the display industry is Gorilla Glass from Corning Incorporated, Corning, N.Y. In some other implementations, the cover is a stainless steel cover, a cover of a nickel-cobalt ferrous alloy (e.g., Kovar from Carpenter Technology Corporation, Wyomissing, Pa.), or a cover of a ceramic material.

In some implementations, treating the SAM coating results in improved strength of the cover/substrate bond. Because the substrate is coated with a SAM coating, bonding a cover to the substrate with an epoxy, for example, results in an epoxy/SAM coating interface. Treating the SAM coating results in improved strength of the epoxy/SAM coating interface in some implementations. As noted above, the tail groups of a SAM coating present a hydrophobic surface in some implementations. While reducing the susceptibility of an electromechanical systems device to stiction failure, epoxy may not bond well to the hydrophobic surface of the SAM coating that is on the dielectric layer of the substrate if left untreated.

For example, when there is failure at the epoxy and SAM coating interface, the failure may occur in an adhesive mode or a cohesive mode. Adhesive failure is when debonding occurs between the epoxy and the SAM coating. When adhesive failure occurs at the epoxy/SAM coating interface, the epoxy may remain bonded to the cover with substantially no epoxy remaining bonded to the SAM-coated substrate surface. In contrast, cohesive failure of the epoxy seal is when the epoxy itself mechanically fails (for example, via a crack propagating in the epoxy), rather than a debonding failure occurring. When cohesive failure occurs within the epoxy rather than via debonding, the epoxy may remain bonded both to the cover and to the SAM coating. Failure may also occur in both an adhesive mode and a cohesive mode. In some implementations, the methods described herein reduce or substantially eliminate failure occurring in an adhesive mode or an adhesive/cohesive mode.

Adhesive failure is more pronounced with electromechanical systems devices on larger substrates (e.g., electromechanical systems devices on substrates about 5.7 inches on the diagonal and larger). Adhesive failure may indicate a weak bond between the SAM-coated substrate surface and the epoxy or possibly a weak bond between the epoxy and the cover. Without being bound by any theory, it is believed that increased adhesive failure observed in the epoxy bond to the substrate surface or to the cover for a larger substrate is possibly due to the greater amount of flexing or bending with handling that a larger substrate is exposed to as compared to a smaller substrate. When failure of the bond between the cover and the SAM-coated substrate surface occurs, whether in an adhesive mode or a cohesive mode, the electromechanical systems device is exposed to the atmosphere and water vapor in the atmosphere. As noted above, stiction in an electromechanical systems device may be exacerbated by water vapor, leading to premature failure of the electromechanical systems device.

Figure 10A:
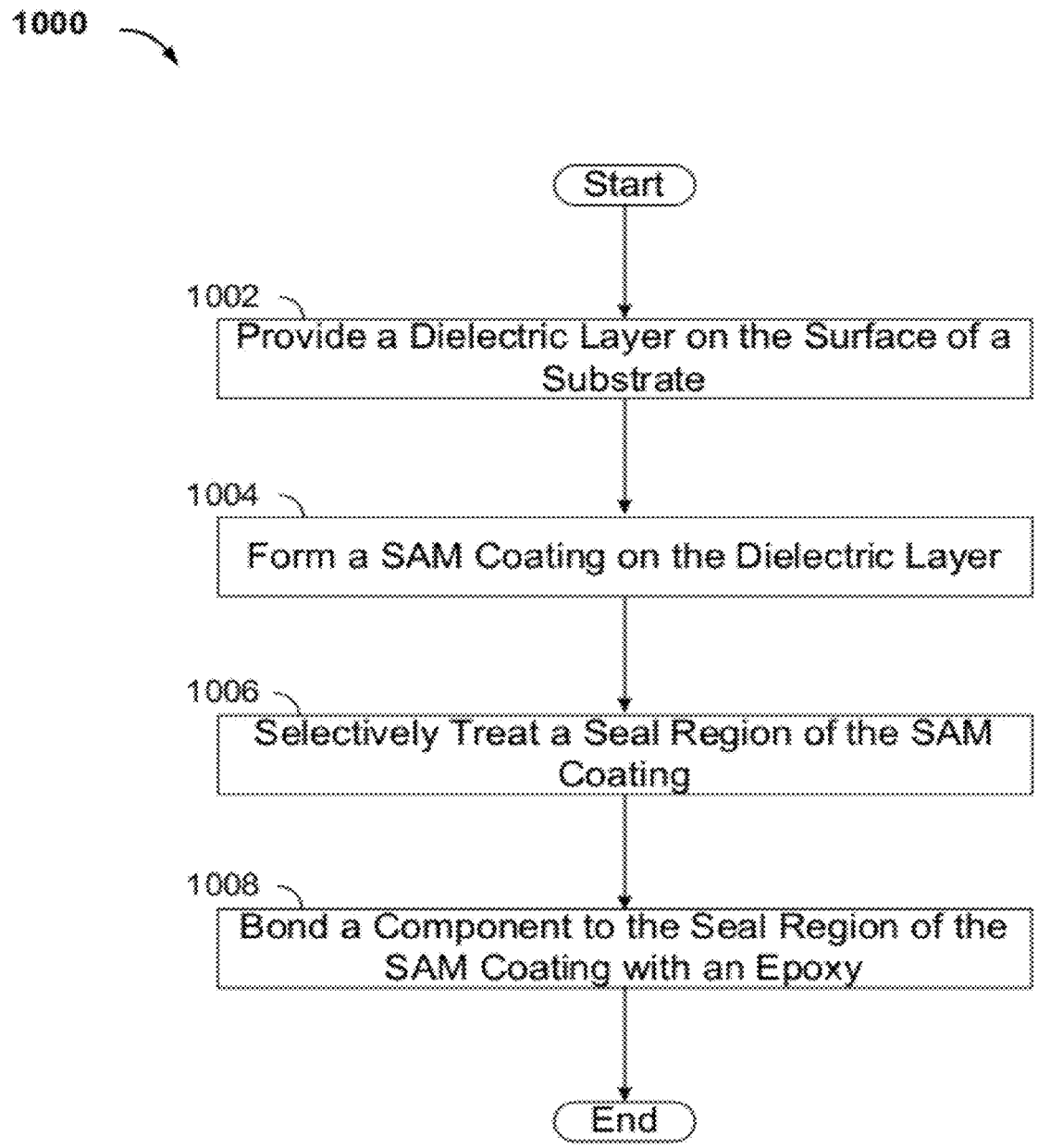
FIG. 10A shows an example of a flow diagram illustrating a manufacturing process for an electromechanical systems apparatus.
Figure 10B:
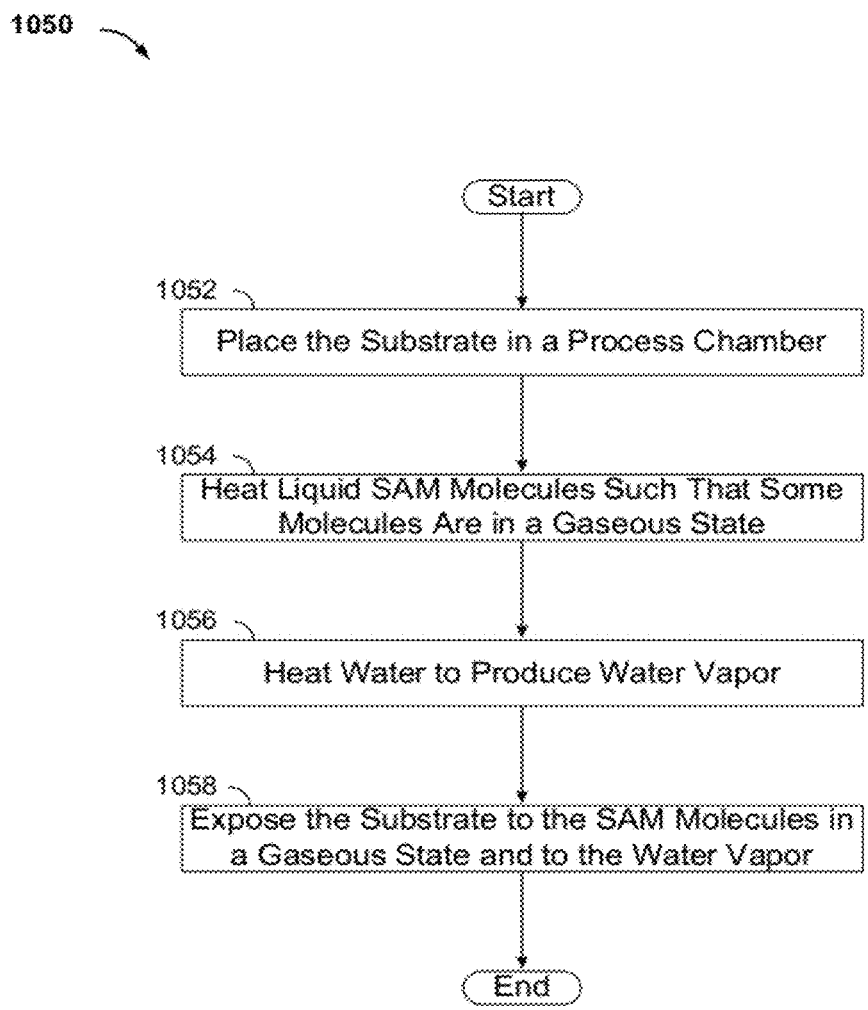
FIG. 10B shows an example of a flow diagram illustrating a process for forming a self-assembled monolayer coating.

FIG. 10A shows an example of a flow diagram illustrating a manufacturing process for an electromechanical systems apparatus. The manufacturing process in FIG. 10A, for example, may be used to bind a cover to encapsulate an electromechanical systems device as described above in the context of FIG. 9. FIG. 10B shows an example of a flow diagram illustrating a process for forming a self-assembled monolayer coating. FIGS. 11A-11E show examples of top-down and cross-sectional schematic diagrams of the material layers formed in the operations of FIGS. 10A and 10B.

Turning first to FIG. 10A, at block 1002 in the method 1000, a dielectric layer on the surface of a substrate is provided. In some implementations, the substrate includes an electromechanical systems device fabricated on the surface. In some implementations, the electromechanical systems device is fabricated on the surface of the substrate before providing the dielectric layer on the surface of the substrate.

Methods of forming a dielectric layer on the surfaces of an electromechanical systems device and the surface of the substrate are described above. As noted above, in some implementations the dielectric layer includes an oxide layer (e.g., silicon oxide, aluminum oxide, zirconium oxide, hafnium oxide, yttrium oxide, tantalum oxide, silicon oxide doped with other oxides), a nitride layer (e.g., silicon nitride), an oxynitride layer, or a carbide layer.

In some implementations, the dielectric layer includes an $Al_2O_3$ layer. In some implementations, the dielectric layer provided on the surface of the substrate is formed with a conformal deposition process, e.g., an ALD process. In some implementations, the dielectric layer on the surface of the substrate is about 20 to 100 Angstroms thick.

Figure 11A:
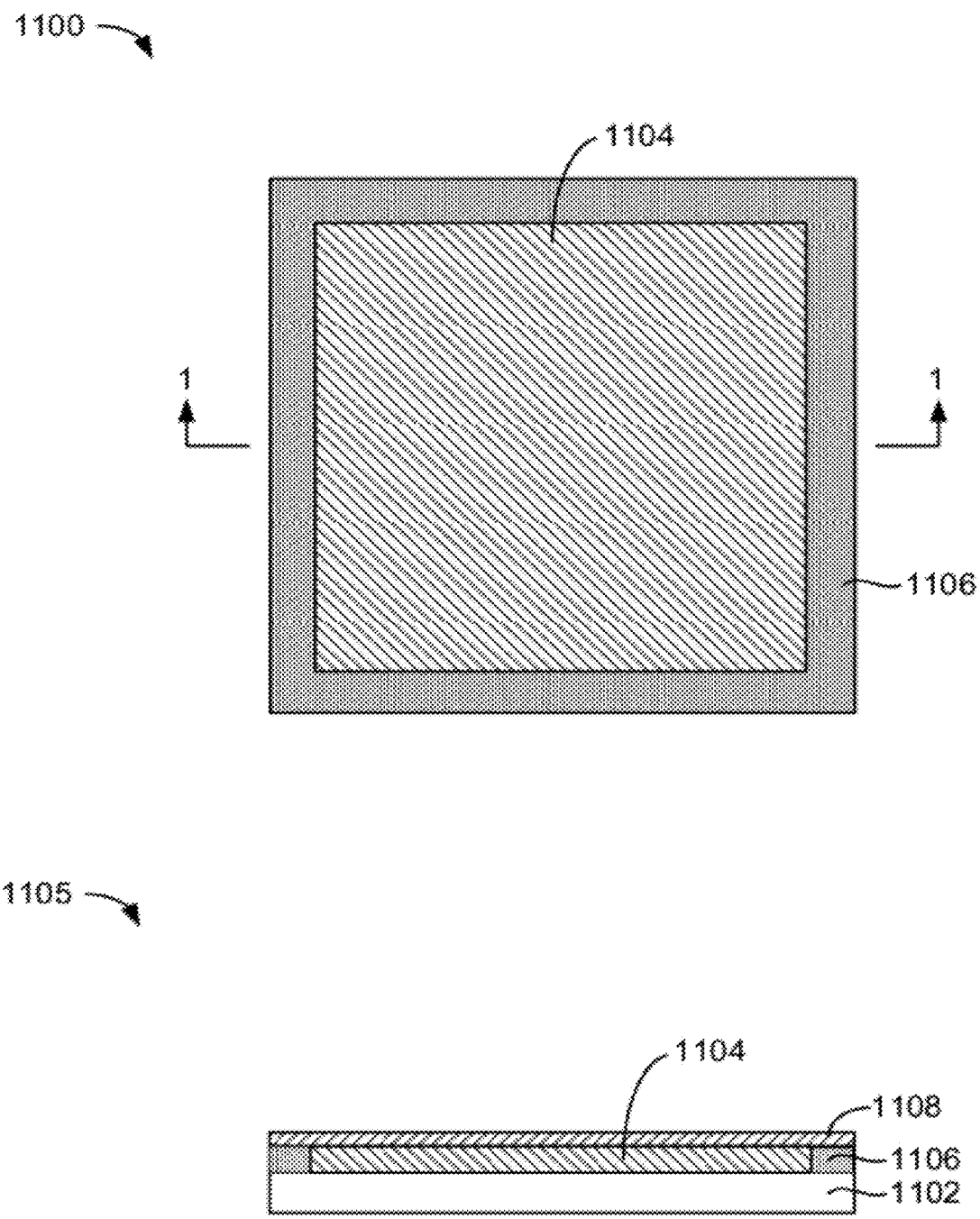
FIGS. 11A-11E show examples of top-down and cross-sectional schematic diagrams of the material layers formed in the operations of FIGS. 10A and 10B.

FIG. 11A shows an example of a top-down schematic diagram and a cross-sectional schematic diagram of a partially fabricated device. The top portion of FIG. 11A depicts a top-down schematic diagram 1100 and the bottom portion of FIG. 11A depicts a cross-sectional schematic diagram 1105 along the direction of arrows 1-1.

The top-down schematic diagram 1100 shows a view of the surface of a substrate. Not shown in the top-down schematic diagram 1100 is a dielectric layer. Included on the on the surface of the substrate is an electromechanical systems device 1104 and a peripheral area 1106. For example, the electromechanical systems device 1104 may be an electromechanical systems display. The peripheral area 1106 may include, for example, peripheral routing as well as electrical pads and/or mounting pads. For example, in IMOD implementations, the peripheral area may include chip on glass (COG) pads and Flex On Glass (FOG) pads for mounting driver chips and flex circuitry for an electromechanical systems display. The substrate may be of any size appropriate to support the electromechanical systems device. For example, a substrate may be about 4 inches square, i.e., about 5.7 inches on the diagonal. Smaller substrates may be about 1 inch square or less. Larger substrates may be about 6 inches square or greater. The substrate may be in other geometries other than a square. For example, the substrate may be rectangular. In some implementations, the electromechanical systems device occupies most of the available area on the surface of the substrate.

The cross-sectional schematic diagram 1105 shows the substrate 1102 including the electromechanical systems device 1104, the peripheral area 1106, and a dielectric layer 1108. The dielectric layer 1108 is disposed on the exposed external and internal (not shown) surfaces of the electromechanical systems device 1104 and the peripheral area 1106. For example, in an IMOD implementation, the dielectric layer 1108 may cover the peripheral routing, COG and FOG pads, as well as the under the mirrors in the active IMOD display area. In addition to peripheral routing, electrical pads, and other components that may be present in the peripheral area 1106, the peripheral area 1106 includes a seal region. The seal region is a region to which a cover will be sealed and generally extends around the periphery of the electromechanical systems device, without covering COG, FOG, or other pads configured for connection to external components.

At block 1004 in the method 1000, a self-assembled monolayer (SAM) coating is formed on the dielectric layer. Methods of forming a SAM coating on the dielectric layer and are described further below with respect to FIG. 10B. In some implementations, the SAM coating includes an organosilane or an organosiloxane. In some implementations, the SAM coating includes n-decyl-trichlorosilane. Other examples of SAM coatings are described above with respect to FIG. 9.

Figure 11B:
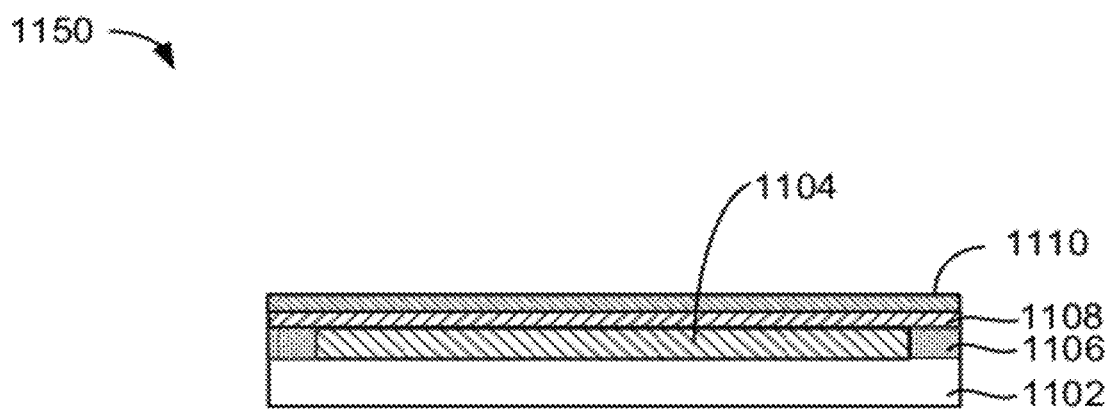

FIG. 11B shows an example of cross-sectional schematic diagram of a SAM coating on the dielectric layer. The cross-sectional schematic diagram 1150 shows the substrate 1102 including the electromechanical systems device 1104, the peripheral area 1106, the dielectric layer 1108, and the SAM coating 1110. The SAM coating 1110 is disposed on the surfaces that were previously coated with the dielectric layer; i.e., the external and internal (not shown) surfaces of the electromechanical systems device 1104 and the peripheral area 1106. It should be noted that although dielectric layer 1108 and 1110 are depicted schematically as planar layers, they conformally coat the surfaces of the electromechanical systems device 1104 and peripheral area 1106.

FIG. 10B shows an example of a flow diagram illustrating a process for forming a self-assembled monolayer coating. The method 1050 may be used in block 1004 in the method 1000 in FIG. 10A, or in block 908 of the method 900 in FIG. 9, to form a SAM coating on a dielectric layer, for example.

At block 1052 in the method 1050, the substrate is placed in a process chamber. The process chamber may be a vacuum chamber and may include ports through which gases may be admitted. The process chamber may also include heaters for heating the vacuum chamber walls or the substrate support to indirectly heat the substrate. In some implementations, the substrate is heated to about 30 to 75° C. or to about 45° C. In some implementation, the process chamber is evacuated (i.e., a vacuum is pulled on the process chamber).

At block 1054, SAM molecules in a liquid state (i.e., amphiphilic molecules in a liquid state) are heated such that some of the SAM molecules are converted to a gaseous state. For example, when n-decyl-trichlorosilane (DTS) is used as the SAM coating, liquid DTS may be heated to about 95 to 120° C. or to about 105 to 110° C. In some implementations, the liquid SAM molecules are heated in a first prechamber that is separate from the process chamber. After the liquid SAM molecules are heated in the first prechamber, SAM molecules in a gaseous state are admitted to a second prechamber by opening a valve between the first prechamber and the second prechamber.

At block 1056, water is heated to produce water vapor. In some implementations, the water is heated in a third prechamber that is separate from the process chamber. After the water is heated in the third prechamber, water vapor is admitted to a fourth prechamber by opening a valve between the third prechamber and the fourth prechamber.

At block 1058, the substrate is exposed to the SAM molecules in a gaseous state and to the water vapor. For example, when the process chamber has been evacuated at block 1052, the substrate may be exposed to the SAM molecules in a gaseous state and to the water vapor by opening valves of the process chamber that connect the process chamber to the third and fourth prechambers. After exposure of the substrate to the SAM molecules in a gaseous state and to the water vapor, the SAM coating forms on the dielectric layer.

Without being bound by any theory, it is believed that the water crosslinks the SAM molecules as the SAM coating is forming. This may aid the wear resistance of the SAM coating. In some implementations, the substrate is exposed to the gaseous SAM molecules without exposing the substrate to water vapor.

Returning to the method 1000 in FIG. 10A, at block 1006 a seal region of the SAM coating is selectively treated. In some implementations, selectively treating a seal region of the SAM coating removes tail groups of the SAM coating in the seal region. In some implementations, selectively treating a seal region of the SAM coating improves the adhesion of epoxy or other adhesive material to the treated SAM coating.

Figure 11C:
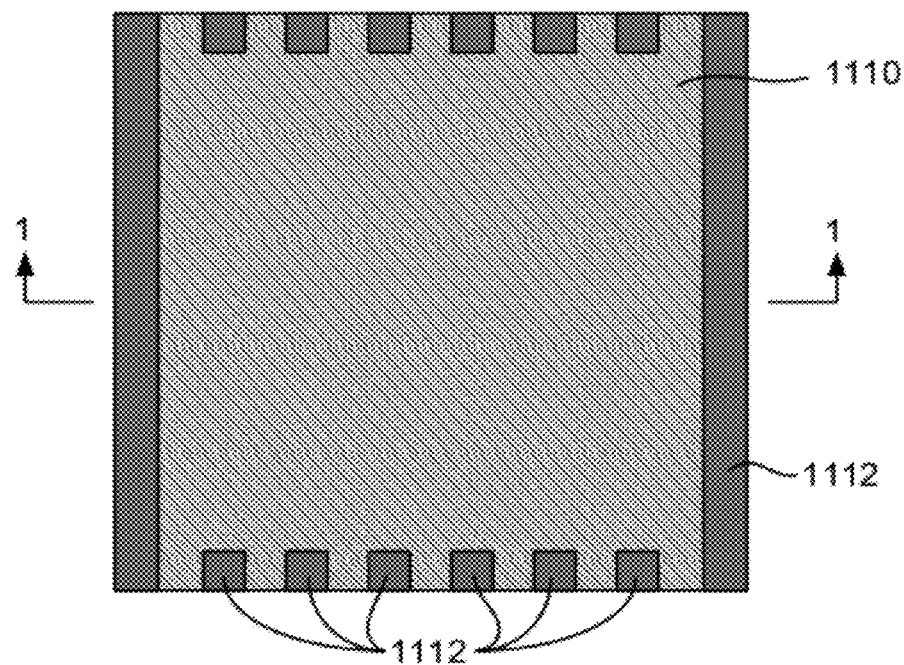
Figure 11C:
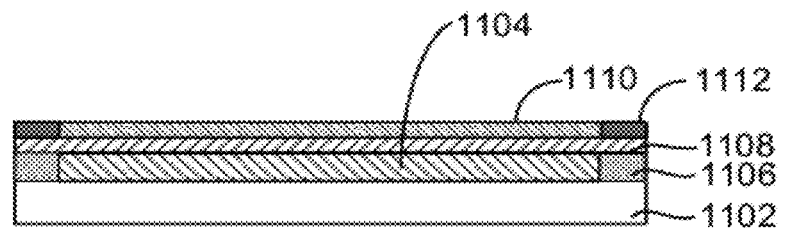

FIG. 11C shows an example of a top-down schematic diagram and a cross-sectional schematic diagram of a partially fabricated device. The top portion of FIG. 11C depicts a top-down schematic diagram 1160 and the bottom portion of FIG. 11C depicts a cross-sectional schematic diagram 1165 along the direction of arrows 1-1.

The top-down schematic diagram 1160 shows the SAM coating 1110 and the treated potions 1112 of the SAM coating. The pattern of the treated portions 1112 of the SAM coating 1110 along the top edge and the bottom edge is due to the method used to treat the SAM coating. Some methods may produce such a pattern or other pattern when treating the SAM coating.

The cross-sectional schematic diagram 1165 shows the substrate 1102 including the electromechanical systems device 1104, the peripheral area 1106, the dielectric layer 1108, the SAM coating 1110, and the treated portions 1112 of the SAM coating. It should be noted that while the treated portions 1112 of the SAM coating are depicted schematically as occupying the entire width of the peripheral area 1106, they may occupy a narrower band within the peripheral area 1106.

The seal region of the SAM coating may be selectively treated using many different techniques. As noted above, selectively treating a seal region of the SAM coating removes tail groups of the SAM coating in the seal region, in some implementations. Selectively treating the seal region refers to treating the seal region without significantly affecting the regions of the SAM coating adjacent to the seal region. One having ordinary skill in the art will understand that some small amount of removal of the tail groups of the SAM coating may occur in regions close to the selectively treated seal region of the SAM coating. In some implementations, selectively treating the seal region involves removal of the tail groups of the SAM coating only in the seal region without significant tail group removal of any other region of the SAM coating.

In some implementations, selectively treating the seal region includes selectively exposing the seal region to ultraviolet light in an oxidizing atmosphere. Selectively exposing the seal region to ultraviolet light in an oxidizing atmosphere refers to exposing the seal region, without exposing at least the regions adjacent to the seal region, to ultraviolet light in an oxidizing atmosphere. This may be accomplished by selective exposure to ultraviolet light and/or to an oxidizing atmosphere according to the desired implementation.

The ultraviolet light is of a wavelength and intensity such that tail groups may be removed from the SAM coating. Wavelengths of ultraviolet light may range from about 10 to 400 nanometers (nm) and the intensity of the ultraviolet light may range from about 5 to 17 milliWatts per centimeter squared ($mW/cm^2$). For example, the ultraviolet light may be at a wavelength of about 254 nm and an intensity of about 11 $mW/cm^2$.

The process chamber in which the work piece is situated may be purged with nitrogen for about two minutes prior to the ultraviolet light exposure. Ultraviolet light exposure then occurs under an oxidizing atmosphere in the process chamber. For example, appropriate oxidizing atmospheres may include substantially pure oxygen, oxygen mixed with an inert gas, or air. For example, during the ultraviolet light exposure, air may be admitted to the process chamber at a rate of about 0.5 liters per minute (L/min). In some implementations, the duration of the flow and the ultraviolet light exposure is about 300 seconds. In some implementations, the ultraviolet light and the oxidizing atmosphere form ozone which reacts with the SAM coating and removes the tail groups from the SAM coating. In some other implementations, ozone or another oxidant is formed in a separate chamber by exposing an oxidizing atmosphere to ultraviolet light. Then, all or part of the seal region of the SAM coating may be selectively exposed to the ozone.

As described above, a SAM coating is a layer of amphiphilic molecules. In some implementations, the amphiphilic molecules have a polar, water-soluble group (i.e., the head group) attached to a nonpolar, water-insoluble hydrocarbon chain (i.e., the tail group). The head groups of the amphiphilic molecules show affinity for a substrate and bond to the substrate. The tail groups of the amphiphilic molecules extend from the head groups and present a hydrophobic surface. In some implementations, the SAM coating includes organic tail groups, as noted above. Selectively removing the tail groups in the seal region of the SAM coating removes substantially all of the tail groups of the SAM coating, in some implementations. Selectively removing the tail groups in the seal region of the SAM coating removes some of the tail groups of the SAM coating, in some other implementations. In some implementations, selectively removing the tail groups in the seal region of the SAM coating forms a silicon oxide layer on the dielectric layer.

In some implementations, treating the SAM coating results in a surface to which the epoxy strongly bonds. For example, some implementations include an $Al_2O_3$ layer on the substrate formed via an atomic layer deposition (ALD) process. As noted above, some ALD process form an $Al_2O_3$ layer with a surface terminated with hydroxyls. The SAM coating, in some implementations, is n-decyl-trichlorosilane (DTS). DTS includes a silicon atom, three chlorine atoms bonded to the silicon atom, and a ten-carbon hydrocarbon chain bonded to the silicon atom; the silicon atom and the three chlorine atoms make up the head group, and ten-carbon hydrocarbon chain makes up the tail group. When DTS bonds to an $Al_2O_3$ layer terminated with hydroxyls, the silicon atoms of DTS molecules bond to the oxygen from the hydroxyls on the $Al_2O_3$ surface; chlorine from the DTS and hydrogen from the hydroxyls of the $Al_2O_3$ layer are volatile byproducts of this reaction. The resulting chemical structure is a silicon atom of a DTS molecule bonded to two oxygen atoms on the $Al_2O_3$ surface, with the hydrocarbon chain of a DTS molecule sticking up from the $Al_2O_3$ surface. Without being bound by any theory, it is believed that when a DTS coated $Al_2O_3$ surface is exposed to ultraviolet light and ozone produced by the ultraviolet light, the hydrocarbon chains are removed, leaving a single mono-layer of silicon dioxide on the surface of the ALD $Al_2O_3$.

In some implementations, exposing the seal region of the SAM coating to ultraviolet light in an oxidizing atmosphere is performed using a mask. The mask includes open regions defining the regions of the SAM coating that are exposed to ultraviolet light, in some implementations. The mask includes regions transparent to ultraviolet light, defining the regions of the SAM coating that are exposed to ultraviolet light, in some other implementations. The mask allows for the selective treatment of the seal region of the SAM coating.

Figure 12A:
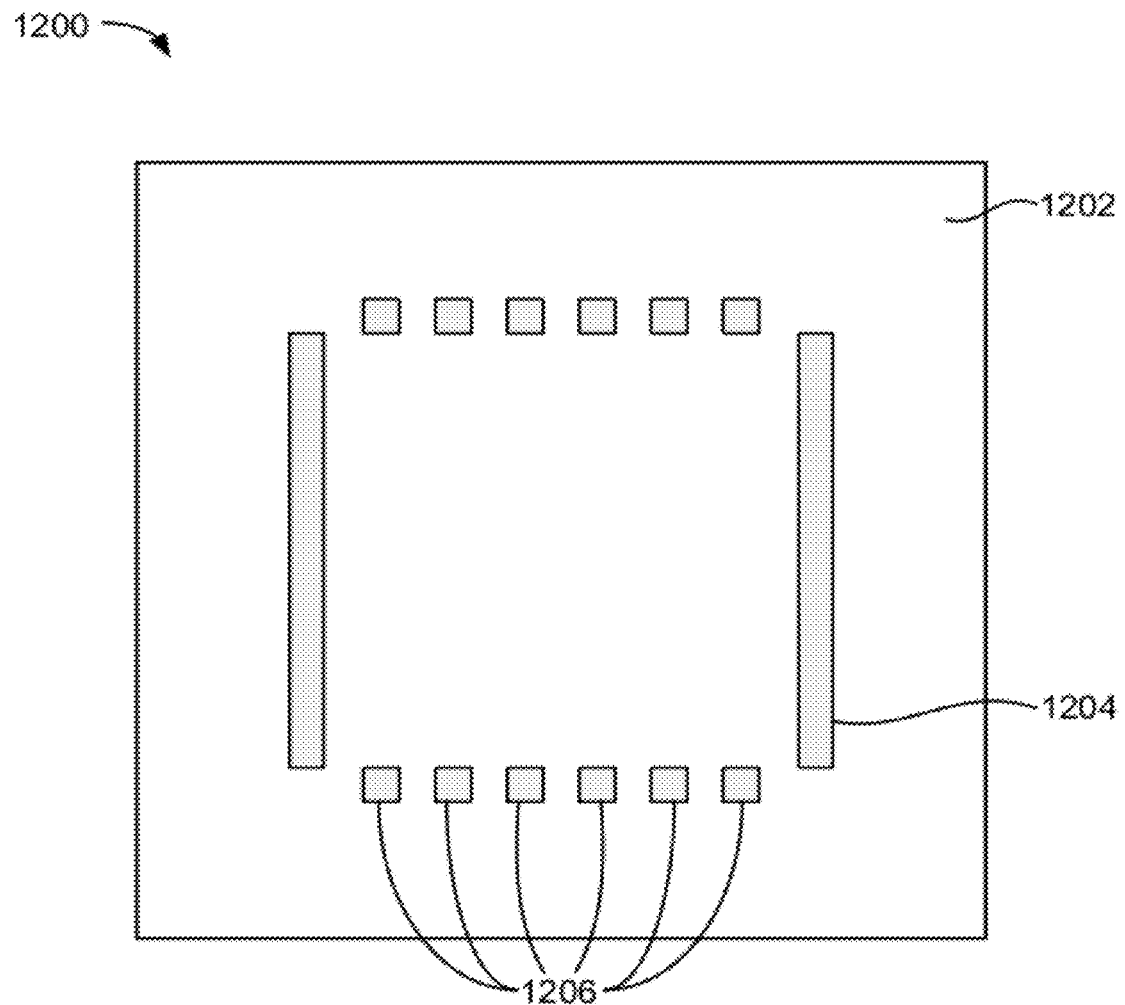
FIGS. 12A and 12B shows examples of schematic diagrams of masks.
Figure 12B:
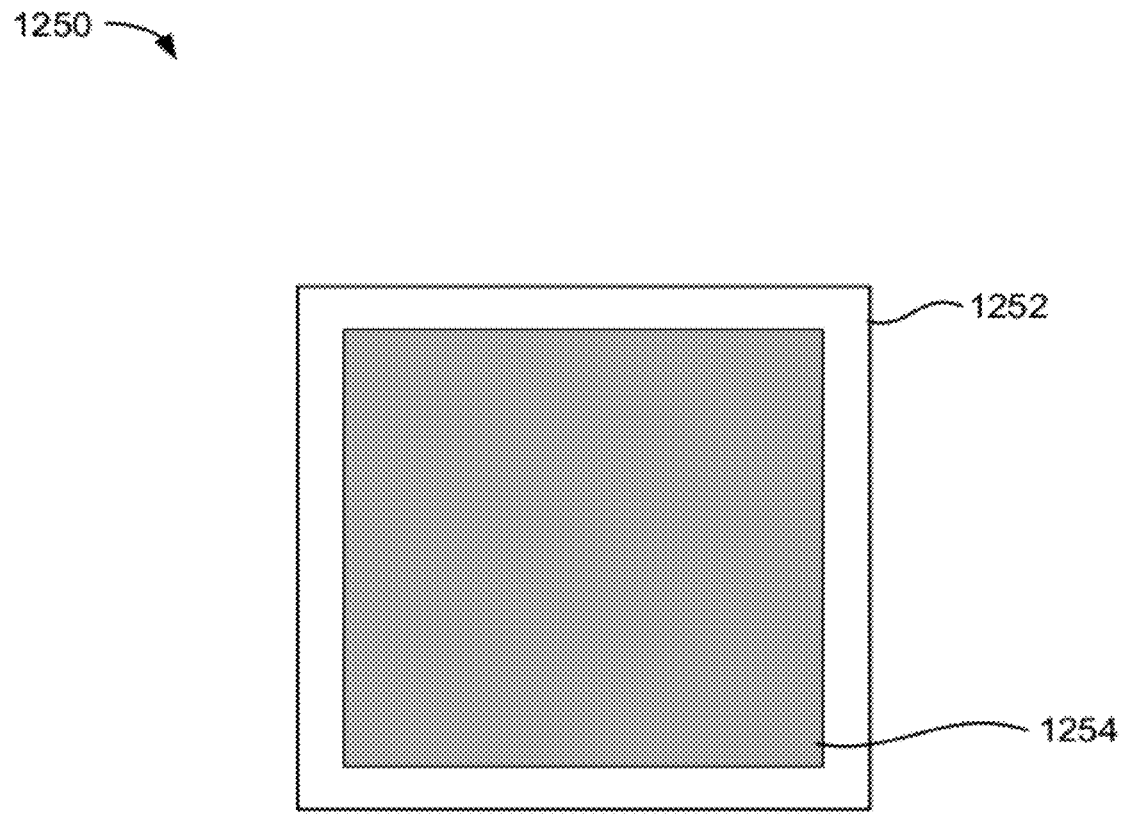

FIGS. 12A and 12B shows examples of schematic diagrams of masks. In FIG. 12A, the mask 1200 includes a sheet of material 1202, such as a metal, for example, having cut-outs 1204 and 1206. A substrate may be positioned under the mask 1200 and ultraviolet light may be directed at the mask. The cut-outs 1204 and 1206 define portions of the SAM coating that will be selectively exposed to ultraviolet light in the seal region, as in the top-down schematic diagram 1160 shown in FIG. 11C. The mask serves to preserve the SAM coating of the electromechanical systems device 1104 by not allowing the external and internal surfaces of the electromechanical systems device to be exposed to the ultraviolet light. Surfaces that are not exposed to ultraviolet light are not exposed to ozone.

In FIG. 12B, the mask 1250 includes a sheet of material 1252 that is transparent to ultraviolet light with a layer of metal 1254 on the sheet of material. The sheet of material may be quartz, for example. The metal 1254 may be deposited on the sheet of material 1252 such that it is thick enough to block ultraviolet light. The regions of the sheet of material 1252 not covered with the layer of metal 1254 define portions of the SAM coating that will be selectively exposed to the ultraviolet light in the seal region. Other patterns in a mask may be used according to the particular implementation.

As noted above, selectively treating the seal region of the SAM coating may be performed with different techniques. In some implementations, selectively treating the seal region of the SAM coating includes selectively exposing the seal region to an oxidizing plasma. For example, the substrate may be placed in a plasma reaction chamber and selected regions of the substrate exposed to a plasma including oxidizing species to selectively treat the SAM coating. A mask, similar to the mask used in the ultraviolet light exposure technique, may be used with the oxidizing plasma technique.

In some implementations, an oxidizing plasma includes oxidizing ions and/or radical species. In some implementations, the seal region is exposed to oxygen radicals. The plasma may be direct or remotely-generated. Generating a direct plasma involves striking a plasma in an area in which the substrate is situated. For example, a plasma may be struck between a pedestal on which a substrate rests and a gas distribution plate above the substrate. In some implementations, plasma species may be remotely generated and fed into a substrate exposure area.

In some implementations, selectively treating the seal region of the SAM coating includes selectively exposing the seal region to an excitation energy in an oxidizing atmosphere. For example, a heat source capable of heating small surface areas of a substrate or a laser may be used in an oxidizing atmosphere to selectively heat regions of the SAM coating to remove the tail groups. A mask may not be needed in these implementations when the heat source or laser may be directed to specific areas of a substrate. In addition to thermal energy, excitation energies include radiative energies, such as ultraviolet, infrared, and microwave energy, and plasma energy. Some implementations of these are discussed above.

In some implementations in which the dielectric layer is not coated with a SAM coating, an ALD step is used to form a silicon-oxygen surface on the surface of the dielectric layer. Such a surface may also have good adhesion properties with epoxies. For example, when a dielectric layer of $Al_2O_3$ is deposited via ALD, the last ALD step may include a silicon precursor gas and not an aluminum precursor gas. Examples of common silicon precursor gases include silane and silanol. In these implementations, however, any benefit of a SAM coating would not be present due to the dielectric layer not being coated with a SAM coating.

Returning to method 1000 in FIG. 10, at block 1008 a component is bonded to the seal region of the SAM coating with an epoxy. In some implementations, the substrate includes an electromechanical systems device disposed thereon, and the component is part of an element configured to encapsulate the electromechanical systems device. For example, the component may be a cover or part of a cover as described above with reference to FIG. 9. In some implementations, the component includes a borosilicate glass component.

Figure 11D:
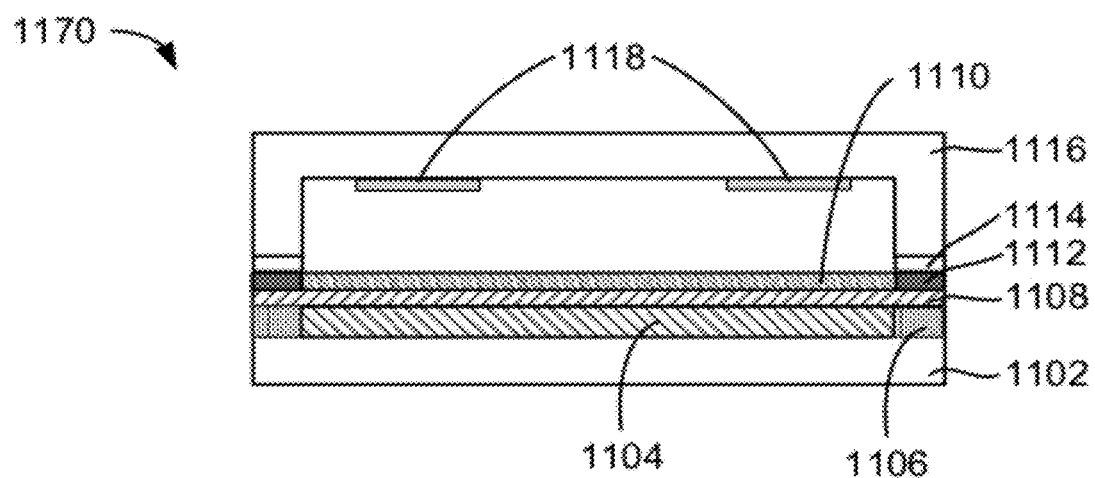

FIG. 11D shows an example of cross-sectional schematic diagram of an electromechanical systems apparatus with a cover that encapsulates the electromechanical systems device. The cross-sectional schematic diagram 1170 shows the substrate 1102 including the electromechanical systems device 1104, the peripheral area 1106, the dielectric layer 1108, the SAM coating 1110, and the treated portions 1112 of the SAM coating. An epoxy 1114 bonds a cover 1116 to the treated portions 1112 of the SAM coating. In some implementations, the cover is a glass cover. In some implementations, desiccant elements 1118 are included with the cover. Although the epoxy 1114 is depicted schematically as extending the entire width of the peripheral region 1106, as indicated above it may occupy a narrower band of the peripheral region to allow access to electrical or mounting pads and the like.

Figure 11E:
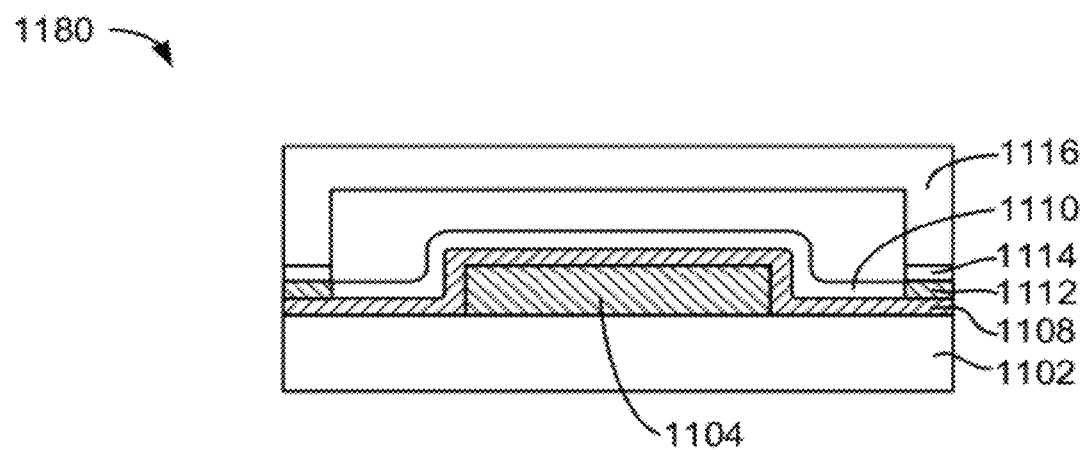

FIG. 11E shows another example of a cross-sectional schematic diagram of an electromechanical systems apparatus with a cover that encapsulates the electromechanical systems device. The apparatus shown in FIG. 11E is similar to the apparatus shown in FIG. 11D, except that in FIG. 11E, the electromechanical systems device is fabricated on a region of the substrate, leaving other portions of the substrate or overlying layers on the substrate exposed. In FIG. 11E, the cross-sectional schematic diagram 1180 shows the substrate 1102 including the electromechanical systems device 1104, the dielectric layer 1108, the SAM coating 1110, and the treated portions 1112 of the SAM coating. An epoxy 1114 bonds a cover 1116 to the treated portions 1112 of the SAM coating.

Figure 13:
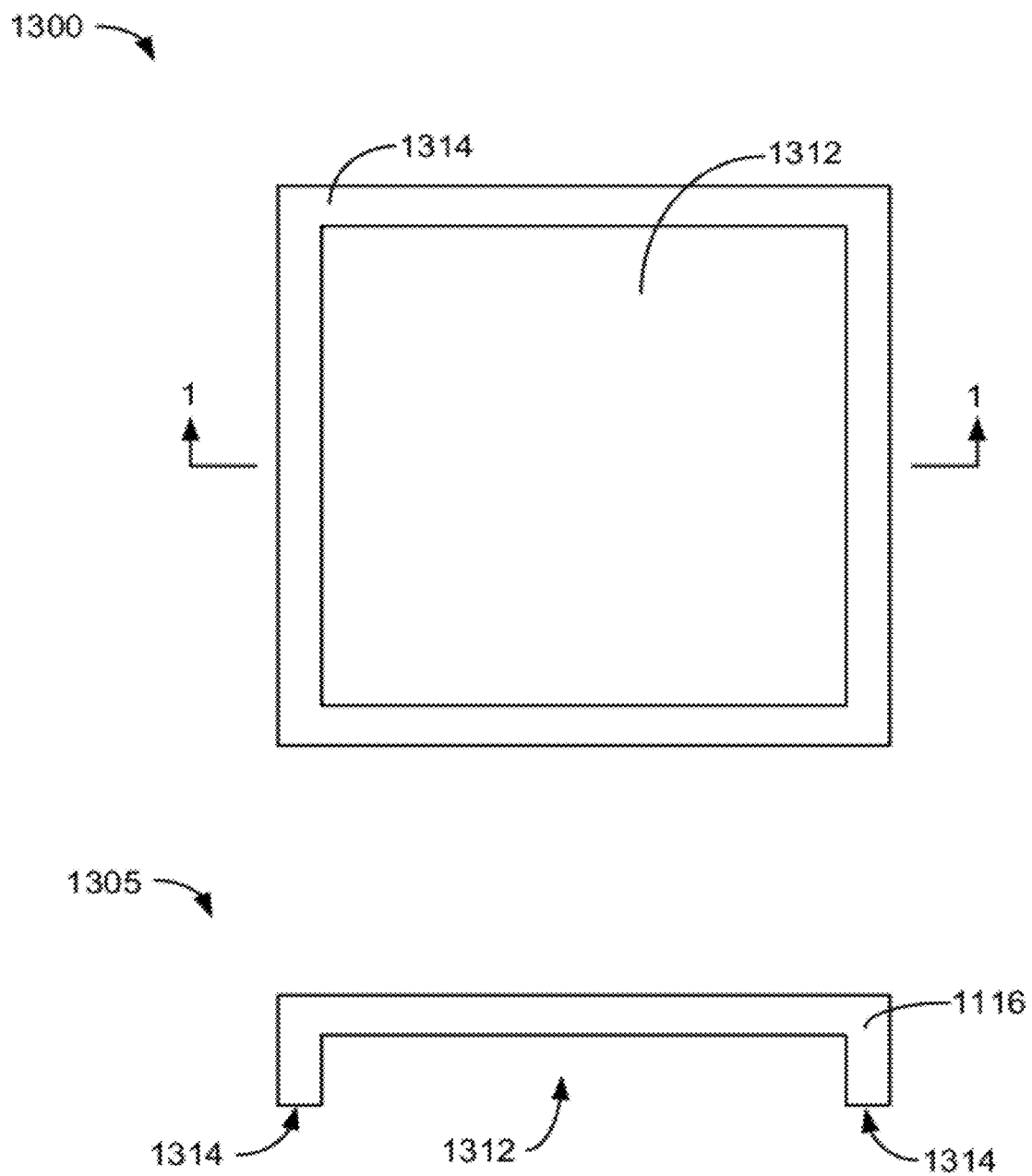
FIG. 13 shows an example of a schematic diagram of a cover.

FIG. 13 shows an example of a schematic diagram of a cover. The cross-sectional schematic diagram 1305 is a view of cover 1116 along the direction of arrows 1-1 and shows a recessed region 1312. The portion 1314 of the cover 1116 is bonded to the treated portions of the SAM coating with an epoxy. The bottom-up schematic diagram 1300 of the cover shows a recessed region 1312 and the portions 1314. As noted above, in some implementations, the entire cover is a glass. For example, the cover may be a borosilicate glass. The cover may also be any type of glass used in the display industry.

In some implementations, the epoxy includes an ultraviolet light-curable epoxy, and bonding the component to the seal region of the SAM coating with the ultraviolet light-curable epoxy includes curing the epoxy by exposing the epoxy to ultraviolet light. Ultraviolet light-curable epoxies are well known to one having ordinary skill in the art. Two examples of ultraviolet light-curable epoxies are epoxy types XNR5570 and XNR5516 from Nagase ChemteX Corp., Osaka, Japan.

In some implementations, the epoxy includes a thermally-curable epoxy, and bonding the component to the seal region of the SAM coating with the thermally-curable epoxy includes curing the epoxy by exposing the epoxy to an elevated temperature. Thermally-curable epoxies are well known to one having ordinary skill in the art.

In some implementations, treating a seal region of the SAM coating to remove tail groups from the seal region improves the adhesion of epoxy to the SAM coating. For example, for an $Al_2O_3$ layer formed via an atomic layer deposition (ALD) process with an n-decyl-trichlorosilane (DTS) SAM coating, as described above, an improvement in the epoxy bond to a DTS coating treated via ultraviolet light-exposure is evident from the failure mode of the bond. In cases where the DTS coating has been exposed to ultraviolet light, the failure mode is generally cohesive, with cracks propagating within the epoxy itself. In cases where the DTS coating has not been exposed to ultraviolet light, the failure mode is generally adhesive, in which debonding occurs between the epoxy and the DTS coating. Without being bound by any theory, it is believed that the epoxy bonds more strongly to the single mono-layer of silicon dioxide on the surface of the ALD $Al_2O_3$ after the DTS is treated. The generally cohesive failure mode improves the strength of the epoxy/DTS interface.

Improvements in the epoxy/SAM coating bonding allow for the fabrication of electromechanical systems apparatus with improved performance. The dielectric layer and the SAM coating may serve to mitigate stiction in an electromechanical systems device of the electromechanical systems apparatus. The strong bond able to be formed between the cover and the substrate of the electromechanical systems apparatus results in less failure at this interface, and in turn, reduced water vapor contamination of the electromechanical systems device. The overall result of these effects is an electromechanical systems apparatus that will operate for a longer period of time before failure due to stiction in the electromechanical systems device.

As noted above, implementations of the methods 900, 1000, and 1050 may be used to fabricate an electromechanical systems apparatus. In some implementations, an apparatus includes a substrate including a surface, a dielectric layer disposed on the surface of the substrate, a self-assembled monolayer (SAM) coating disposed on the dielectric layer, and a seal region of the SAM coating. The seal region includes a portion of the SAM coating that has been treated. In some implementations, the apparatus includes a cover, the cover being bonded to the seal region of the substrate with an epoxy. In some implementations, the substrate includes a borosilicate glass.

In some implementations, the dielectric layer in the apparatus is about 20 to 100 Angstroms thick. In some implementations, the dielectric layer in the apparatus includes an $Al_2O_3$ layer.

In some implementations, the substrate further includes a device region of the substrate. The device region of the substrate includes an electromechanical systems device, and the cover is configured to encapsulate the electromechanical systems device. In some implementations, the electromechanical systems device of the apparatus includes a display. For example, the display may be an IMOD type display or an OLED type display.

Figure 14A:
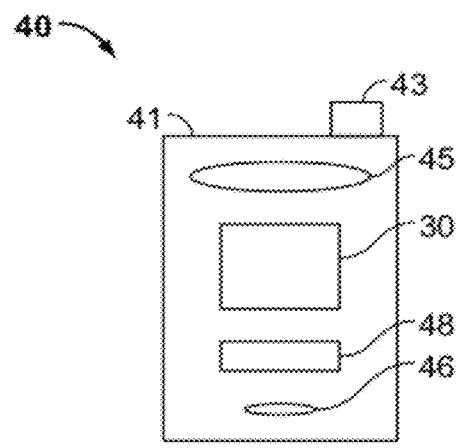
FIGS. 14A and 14B show examples of system block diagrams illustrating a display device that includes a plurality of interferometric modulators.
Figure 14B:
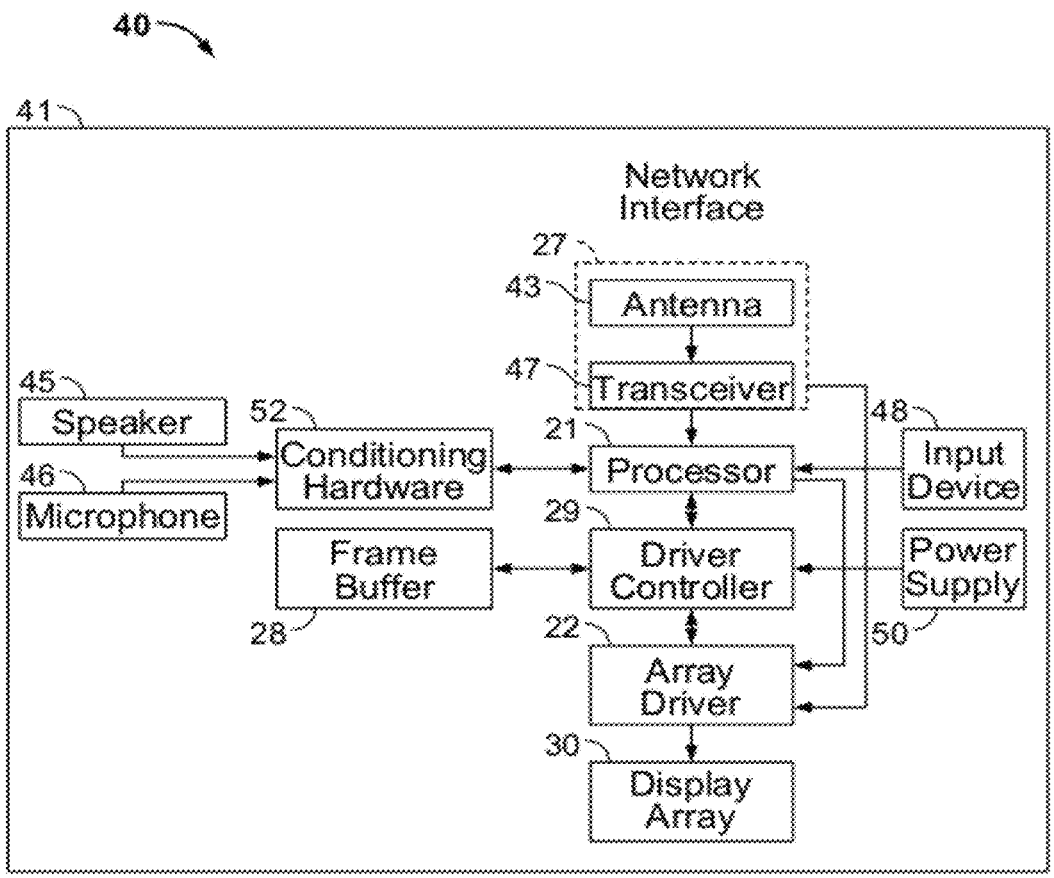

FIGS. 14A and 14B show examples of system block diagrams illustrating a display device 40 that includes a plurality of interferometric modulators. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 14B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method comprising:
   providing a dielectric layer on a surface of a substrate, over an electromechanical systems device disposed on the substrate;
   forming a self-assembled monolayer on the dielectric layer;
   selectively treating a seal region of the self-assembled monolayer; and
   bonding a component to the seal region of the self-assembled monolayer with an epoxy.

2. The method of claim 1, wherein selectively treating a seal region of the self-assembled monolayer includes selectively exposing the seal region to ultraviolet light in an oxidizing atmosphere.

3. The method of claim 2, wherein selectively exposing the seal region to ultraviolet light in an oxidizing atmosphere is performed using a mask, the mask including open regions defining the seal region.

4. The method of claim 2, wherein the ultraviolet light and the oxidizing atmosphere form ozone.

5. The method of claim 1, wherein the self-assembled monolayer includes tail groups, and wherein selectively treating a seal region of the self-assembled monolayer removes the tail groups of the self-assembled monolayer in the seal region.

6. The method of claim 1, wherein selectively treating a seal region of the self-assembled monolayer includes selectively exposing the seal region to an oxidizing plasma.

7. The method of claim 1, wherein selectively treating a seal region of the self-assembled monolayer includes selectively exposing the seal region to an excitation energy in an oxidizing atmosphere.

8. The method of claim 1, wherein selectively treating the seal region of the self-assembled monolayer forms a silicon oxide layer on the dielectric layer.

9. The method of claim 1, wherein the dielectric layer includes an alumina layer.

10. The method of claim 1, wherein the dielectric layer provided on the surface of the substrate is formed with an atomic layer deposition process.

11. The method of claim 1, wherein the self-assembled monolayer includes an organosilane or an organosiloxane.

12. The method of claim 1, wherein the self-assembled monolayer includes n-decyl-trichlorosilane.

13. The method of claim 1, wherein the component includes a borosilicate glass component.

14. The method of claim 1, wherein the substrate includes an wherein the component is a part of an element configured to encapsulate the electromechanical systems device.

15. The method of claim 1, further comprising:
fabricating an electromechanical systems device on the surface of the substrate; and
forming the dielectric layer on the electromechanical systems device and the surface of the substrate.

16. The method of claim 1, wherein the epoxy includes an ultraviolet light-curable epoxy, and wherein bonding the component to the seal region of the self-assembled monolayer with the ultraviolet light-curable epoxy includes curing the epoxy by exposing the epoxy to ultraviolet light.

17. The method of claim 1, wherein the epoxy includes a thermally-curable epoxy, and wherein bonding the component to the seal region of the self-assembled monolayer with the thermally-curable epoxy includes curing the epoxy by exposing the epoxy to an elevated temperature.

18. A device fabricated in accordance with the method of claim 1.

19. A method comprising:
providing an alumina layer on a surface of a substrate, over an electromechanical systems device disposed on the substrate;
forming a self-assembled monolayer on the alumina layer;
selectively treating a seal region of the self-assembled monolayer by selectively exposing the seal region to ultraviolet light in an oxidizing atmosphere using a mask, the mask including open regions defining the seal region, wherein the selectively treated seal region of the self-assembled monolayer includes a silicon oxide layer; and
bonding a component to the seal region of the self-assembled monolayer with an epoxy.

20. The method of claim 19, wherein selectively exposing the seal region to ultraviolet light in an oxidizing atmosphere is performed using a mask, the mask including open regions defining the seal region.

21. The method of claim 19, wherein the self-assembled monolayer includes tail groups, and wherein selectively treating a seal region of the self-assembled monolayer removes the tail groups of the self-assembled monolayer in the seal region.

22. An apparatus comprising:
a substrate including a surface;
a device region of the substrate, the device region of the substrate including an electromechanical systems device;
a dielectric layer disposed on the surface of the substrate, over the electromechanical systems device;
a self-assembled monolayer disposed on the dielectric layer;
a seal region of the self-assembled monolayer, the seal region including a portion of the self-assembled monolayer that has been treated; and
a cover, the cover being bonded to the seal region of the self-assembled monolayer with an epoxy.

23. The apparatus of claim 22, wherein the substrate includes a borosilicate glass.

24. The apparatus of claim 22,
wherein the cover is configured to encapsulate the electromechanical systems device.

25. The apparatus of claim 24, wherein the electromechanical systems device includes a display.

26. The apparatus of claim 22, wherein the dielectric layer is about 20 to 100 Angstroms thick.

27. The apparatus of claim 22, wherein the dielectric layer includes an alumina layer.

28. The apparatus of claim 22, further comprising:
a display;
a processor that is configured to communicate with the display, the processor being configured to process image data; and
a memory device that is configured to communicate with the processor.

29. The apparatus as recited in claim 28, further comprising:
a driver circuit configured to send at least one signal to the display.

30. The apparatus as recited in claim 29, further comprising:
a controller configured to send at least a portion of the image data to the driver circuit.

31. The apparatus as recited in claim 28, further comprising:
an image source module configured to send the image data to the processor.

32. The apparatus as recited in claim 31, wherein the image source module includes at least one of a receiver, transceiver, and transmitter.

33. The apparatus as recited in claim 28, further comprising:
an input device configured to receive input data and to communicate the input data to the processor.

* * * * *